(12) United States Patent
Ohsawa

(10) Patent No.: US 6,617,651 B2
(45) Date of Patent: Sep. 9, 2003

(54) SEMICONDUCTOR MEMORY DEVICE

(75) Inventor: Takashi Ohsawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/964,851

(22) Filed: Sep. 28, 2001

(65) Prior Publication Data

US 2003/0015757 A1 Jan. 23, 2003

(30) Foreign Application Priority Data

Jul. 19, 2001 (JP) ........................................ 2001-220461

(51) Int. Cl.$^7$ ............................................... H01L 29/94
(52) U.S. Cl. ..................................... 257/366; 257/365
(58) Field of Search ................................ 257/365, 366

(56) References Cited

U.S. PATENT DOCUMENTS 5,506,436 A * 4/1996 Hayashi et al. ............. 257/351
5,567,959 A * 10/1996 Mineji ......................... 257/69

FOREIGN PATENT DOCUMENTS

| JP | 03-171768 | 7/1991 | |
| JP | 0730001 A | * 1/1995 | ....... H01L/21/8247 |

OTHER PUBLICATIONS

G. Vincent, et al., "Electric field effect on the thermal emission of traps in semiconductor junctions", 1979 American Institute of Physics, pp. 5484–5487.

J. Leiss, et al., "dRAM Design Using the Taper–Isolated Dynamic RAM Cell", IEEE Transactions on Electron Devices, vol. ED–29, No. 4, Apr. 1982, pp. 707–714.

M. Tack, et al., "The Multistable Charge–Controlled Memory Effect in SOI MOS Transistors at Low Temperatures", IEEE Transactions on Electron Devices, vol. 37, No. 5, May 1990, pp. 1373–1382.

H. Wann, et al., "A Capacitorless DRAM Cell on SOI Substrate", 1993 IEEE, pp. 635–638.

P. Chatterjee, et al., "Memory Technology", Digest of Technical Papers, Feb. 1979, pp. 22–23.

* cited by examiner

Primary Examiner—Allan R. Wilson
(74) Attorney, Agent, or Firm—Banner & Witcoff, Ltd.

(57) ABSTRACT

A semiconductor memory device has full depletion type MISFETs to constitute memory cells (MC) on a semiconductor substrate (11) via an insulating film (12). Each MISFET has a semiconductor layer (13), a source region (16), a drain region (17), the semiconductor layer between the source region and the drain region serving as a channel body in a floating state, a main gate (15) on a first side of the channel body, and an auxiliary gate (18) on a second side of the channel body. With a state, in which the channel body is fully depleted by an electric field from the main gate and a portion of the second side of the channel body is capable of accumulating majority carriers by an electric field from the auxiliary gate, as a reference state, the MISFET has a first data state in which the majority carriers are accumulated and a second data state in which the majority carriers are emitted.

10 Claims, 25 Drawing Sheets

CELL REGION

"0" STATE OF FD-TYPE CELL tox=10nm, tBOX=30nm, tSi=25nm,
NA=ni=1.0e10cm$^{-3}$ @300K, p+poly gate

SEMICONDUCTOR MEMORY DEVICE

CROSS REFERENCE TO RELATED APPLICATION

This application claims the benefit of priority under 35 U.S.C. §119 to Japanese Patent Application No. 2001-220461 filed on Jul. 19, 2001, the entire contents of which are incorporated by reference herein.

BACKGROUND OF THE INVENTION

1. Field of the Invention

The present invention relates to a semiconductor memory device, specifically, to a semiconductor memory device having full depletion type MISFETs.

2. Related Background Art

In a related DRAM, a memory cell is composed of an MOS transistor and a capacitor. The scale-down of the DRAM has been remarkably advanced by the adoption of a trench capacitor structure and a stacked capacitor structure. At present, the cell size of a unit memory cell is scaled down to an area of 2 F×4 F=8 $F^2$, where F is a minimum feature size. Namely, the minimum feature size F decreases with the advance of generation, and when the cell size is generally taken to be $\alpha F^2$, a coefficient $\alpha$ also decreases with the advance of generation. Thus, at the present of F=0.18 μm, $\alpha$=8 is realized.

In order to hereafter secure the trend of cell size or chip size which is the same as before, it is demanded to satisfy $\alpha$<8 in F<0.18 μm and further satisfy $\alpha$<6 in F<0.13 μm, and together with microfabrication, the formation of cell size of the possible small area becomes a large problem. Accordingly, various proposals for decreasing the size of the one memory cell with the one transistor and one capacitor to 6 $F^2$ or 4 $F^2$ are made. However, practical use is not easy since there are a technical difficulty that the transistor has to be a vertical type, a problem that electric interference between adjacent memory cells increases, and in addition difficulties in terms of manufacturing technology including fabrication, film formation, and the like.

On the other hand, some proposals for a DRAM in which a memory cell is composed of one transistor without using a capacitor are made as mentioned below.

(1) JOHN E. LEISS et al, "dRAM Design Using the Taper-Isolated Dynamic Cell" (IEEE TRANSACTIONS ON ELECTRON DEVICES, VOL. ED-29, NO. 4, APRIL 1982, pp707–714)

(2) Japanese Patent Laid-open Publication No. H3–171768

(3) Marnix R. Tack et al, "The Multistable Charge-Controlled Memory Effect in SOI MOS Transistors at Low Temperatures" (IEEE TRANSACTIONS ON ELECTRON DEVICES, VOL, 37, MAY, 1990, pp1373–1382)

(4) Hsing-jen Wann et al, "A Capacitorless DRAM Cell on SOI Substrate" (IEDM93, pp635–638)

A memory cell in the document (1) is composed of MOS transistors, each of which has a buried channel structure. Charge and discharge to/from a surface inversion layer is performed using a parasitic transistor formed at a taper portion of an element isolation insulating film to perform binary storage.

A memory cell in the document (2) uses MOS transistors which are well-isolated from each other and uses a threshold voltage of the MOS transistor fixed by a well potential as binary data.

A memory cell in the document (3) is composed of MOS transistors on an SOI substrate. A large negative voltage is applied from the SOI substrate side, and by utilizing accumulation of holes in an oxide film of a silicon layer and an interface, binary storage is performed by emitting and injecting these holes.

A memory cell in the document (4) is composed of MOS transistors on an SOI substrate. The MOS transistor is one in terms of structure, but here a structure, in which a reverse conduction-type layer is formed on top of the surface of a drain diffusion region, whereby a P-MOS transistor for write and an N-MOS transistor for read are substantially combined integrally, is adopted. With a substrate region of the N-MOS transistor as a floating node, binary data are stored by its potential.

However, in the document (1), the structure is complicated and the parasitic transistor is used, whereby there is a disadvantage in the controllability of its characteristic. In the document (2), the structure is simple, but it is necessary to control potential by connecting both a drain and a source of the transistor to a signal line. Moreover, the cell size is large and rewrite bit by bit is impossible because of the well isolation. In the document (3), a potential control from the SOI substrate side is needed, and hence the rewrite bit by bit is impossible, whereby there is a difficulty in controllability. In the document (4), a special transistor structure is needed, and the memory cell requires a word line, a write bit line, a read bit line, and a purge line, whereby the number of signal lines increases.

SUMMARY OF THE INVENTION

According to one aspect of the present invention, a semiconductor memory device having full depletion type MISFETs to constitute memory cells on a semiconductor substrate via an insulating film, each of the MISFETs comprising:

a semiconductor layer formed on the insulating film;

a source region formed in the semiconductor layer;

a drain region formed apart from the source region in the semiconductor layer, the semiconductor layer between the source region and the drain region serving as a channel body in a floating state;

a main gate formed on a first side of the channel body to forms a channel in the channel body; and an auxiliary gate formed on a second side of the channel body, the second side being opposite to the first side, wherein with a state, in which the channel body is fully depleted by an electric field from the main gate and a portion of the second side of the channel body is capable of accumulating majority carriers by an electric field from the auxiliary gate, as a thermal equilibrium state, the MISFET has a first data state in which the majority carriers are accumulated in the portion of the second side of the channel body and a second data state in which the majority carriers accumulated in the portion of the second side of the channel body are emitted.

According to another aspect of the invention, a semiconductor memory device having full depletion type MISFETs to constitute memory cells on a semiconductor substrate, each of the MISFETs comprising:

a pillar semiconductor portion formed on the semiconductor substrate in the form of a pillar shape;

a source region formed in one of a top portion and a bottom portion of the pillar semiconductor portion;

a drain region formed in the other of the top portion and the bottom portion of the pillar semiconductor portion and formed apart from the source region, the pillar semiconductor portion between the source region and the drain region serving as a channel body in a floating state;

a main gate formed on a first vertical face of the channel body to forms a channel in the channel body; and an auxiliary gate formed on a second vertical face of the channel body, the second vertical face being opposite to the first vertical face, wherein with a state, in which the channel body is fully depleted by an electric field from the main gate and a portion of the second side of the channel body is capable of accumulating majority carriers by an electric field from the auxiliary gate, as a thermal equilibrium state, the MISFET has a first data state in which the majority carriers are accumulated in the portion of the second vertical face of the channel body and a second data state in which the majority carriers accumulated in the portion of the second vertical face of the channel body are emitted.

DESCRIPTION OF THE PREFERRED EMBODIMENTS

Prior to an explanation of some embodiments, the case where a partial depletion type MISFET is used as a basic memory cell will be explained. In the partial depletion type MISFET, when a voltage is applied to a gate to form a channel, a channel body is partially depleted and an electric neutral region remains therein. Such a MISFET is referred to as a PD-type MISFET hereinafter. Using the PD-type MISFET, it is possible to dynamically store a first data state in which excessive majority carriers are accumulated in the electric neutral region and a second state in which the excessive majority carriers in the electric neutral region are emitted.

Figure 1:
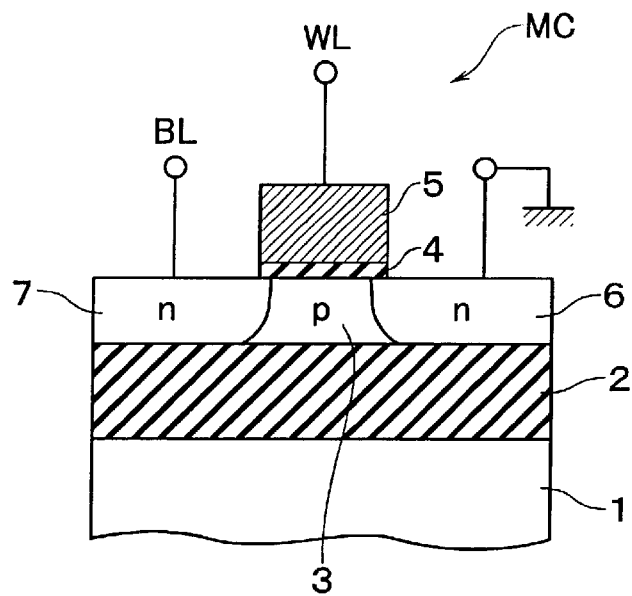
FIG. 1 is a sectional view showing a structure of a memory cell using a PD-type MISFET.

FIG. 1 shows the sectional structure of such a memory cell MC. The memory cell MC has an SOI substrate in which an insulating film 2 like a silicon oxide film is formed on a silicon substrate 1 and a p-type silicon layer 3 is formed on the insulating film 2. The silicon layer 3 is used as the channel body, a gate insulating film 4 is formed thereon, and source and drain diffusion regions 6 and 7 are formed in the silicon layer 3 deep to reach the insulating film 2, so that an n-channel MISFET is composed.

Each memory cell MC composed of the n-channel MISFET has the channel body which is also element-isolated in a cross direction in a floating state, and the memory cells MC are arranged in the form of a matrix to constitute a cell array. The drain region 7 is connected to a bit line BL, the gate 5 is connected to a word line WL and the source region 6 is connected to a fixed potential line.

The operational principle of the memory cell MC utilizes the accumulation of holes which are majority carriers in the channel body (the p-type silicon layer 3) of the MISFET. Specifically, a large electric current is sent from the drain region 7 by a pentode operating in the MISFET to generate impact ionization near the drain junction. Excessive holes which are majority carriers (holes) produced by this impact ionization are held by the channel body, and this state is defined, for example, as data "1". The state in which a forward current is sent between the drain region 7 and the channel body to emit the excessive holes in the channel body to the drain region 7 is defined as data "0".

Figure 2:
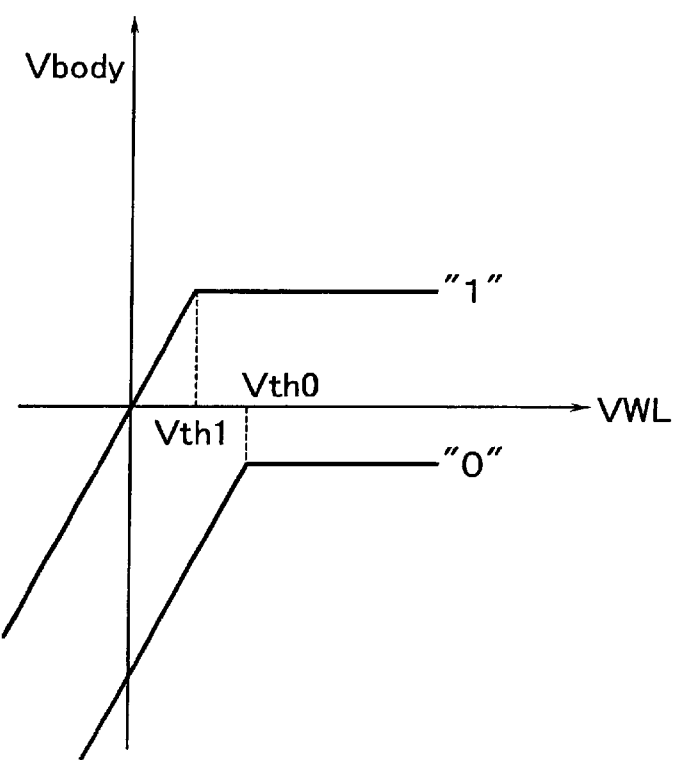
FIG. 2 is a graph showing a relation between a channel body potential and word line voltage to explain an operational principle of the memory cell.

The data "0" and "1" are stored as potential difference in the channel body, that is, as difference in a threshold voltage of the MISFET. Namely, as shown in FIG. 2, a threshold voltage $Vth1$ in a data "1" state in which the channel body potential Vbody is high due to hole accumulation is lower than a threshold voltage $Vth0$ in a data "0" state. In order to maintain the "1" data state in which the holes are accumulated in the channel body, it is preferable that a voltage VWL applied to the word line WL is kept in the negative. This data holding state is not changed even when a read operation is performed as long as the read operation is performed in a linear region and a write operation of inverted data is not performed. Namely, unlike the DRAM in which each memory cell has one transistor and one capacitor and which utilizes charge storage by the capacitor, non-destructive read-out is possible.

Basically, reading data is performed to detect a difference of a conductivity of the memory cell MC. Since the relation between the word line voltage VWL and the channel body potential Vbody is shown in FIG. 2, for example, the word line WL is given a read voltage, which has an intermediate value between the threshold voltages $Vth0$ and $Vth1$ of the data "0" and "1", to detect whether or not a current is passed through the memory cell MC, whereby the data can be detected. Or, the word line voltage VWL in excess of the threshold voltages $Vth0$ and $Vth1$ is given to the word line WL to detect whether the current of the memory cell MC is large or small, whereby the data can be detected.

Figure 3:
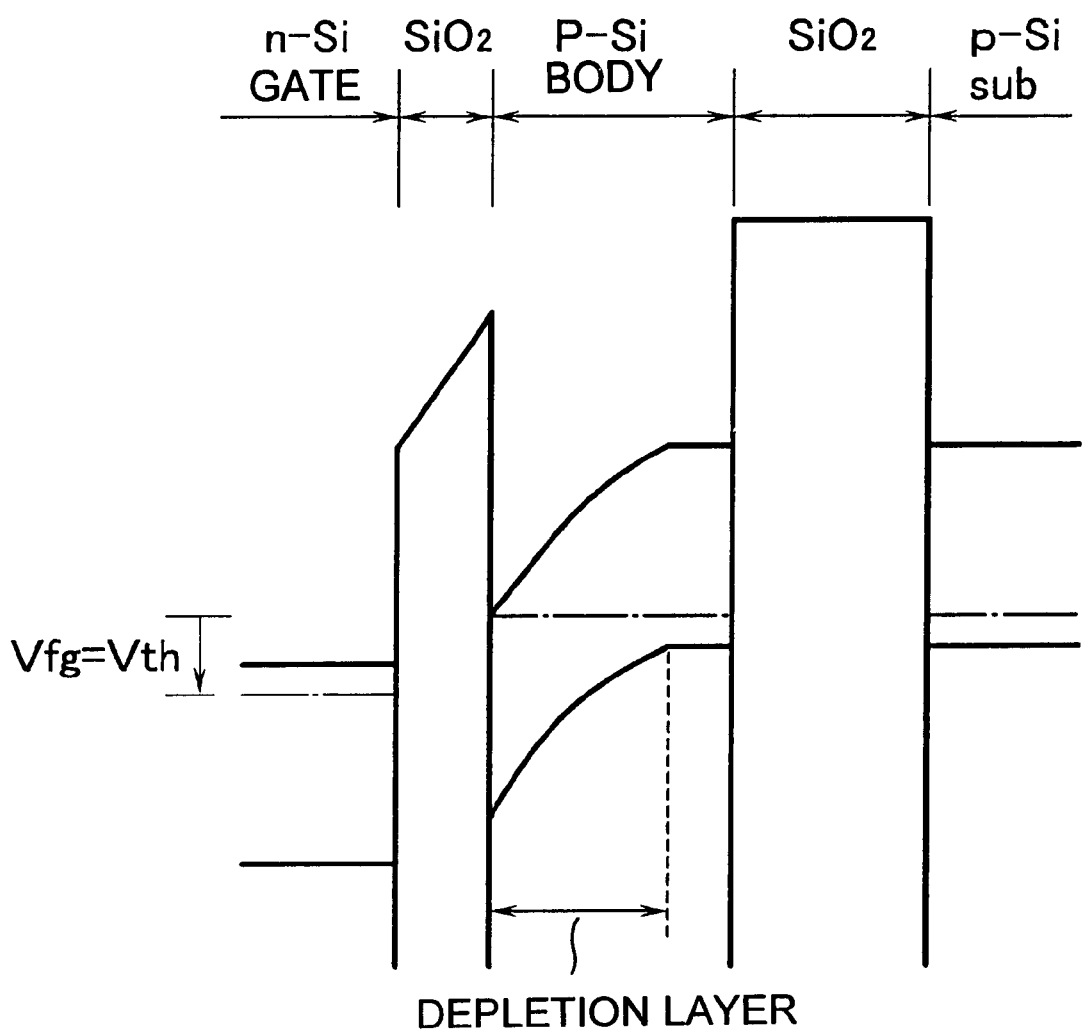
FIG. 3 is a diagram showing a band structure of the memory cell.

The memory cell MC shown in FIG. 1 has the so-called PD-type MISFET in which the electric neutral region exists in the channel body region. Specifically, as describing a band diagram in FIG. 3, when the gate is supplied with the voltage Vfg (=Vth) for forming the channel, a depletion layer extends to the intermediate point of the channel body, the electric neutral region remains near the bottom of the channel body. In this case, according to a scaling rule that the thickness of the channel body region decreases along with a decrease of a design rule, an impurity concentration of the channel body also has to increase. In order to suppress a roll-off effect for agate length (channel length) L in the threshold voltage of the MISFET, namely, in order to suppress a short channel effect, it is necessary to increase the impurity concentration of the channel body together with the decrease of the gate length L.

However, a leak current in a pn junction increases exponentially with the impurity concentration of the channel body. There are a diffusion current, a generation and recombination current and a thermal field emission current (G. Vincent, A. Chantre and D. Bois, "Electric Field Effect on the Thermal Emission of Traps in Semiconductor Junctions," J. Appl. Phys., 50, pp.5484–5487, 1979) in components of the leak current in the pn junction. The two formers of them, that is, the diffusion current and the generation and recombination current are components which decrease if the impurity concentration NA increases. Because, the diffusion current decreases due to a reducibility of a concentration of minority carriers in the electric neutral region if the impurity concentration NA increases, and the generation and recombination current decreases due to a reduction of the depletion layer width if the impurity concentration NA increases. The last components is observed as the leak current because electrons in a deep level of the silicon band gap is emitted by thermal energy and then probability of contribution to conduction is increased by strong electric field in the depletion layer. Namely, it is due to a tunnel effect. According to this theory, since the leak current exponentially depends on the strength of the electric field, the leak current exponentially increases depending on the increase of impurity concentration NA.

In addition, a signal amount $\Delta Vth=|Vth0-Vth1|$, which is a difference between the threshold voltage $Vth0$ in the "0" data cell and the threshold voltage $Vth1$ in the "1" data cell, is defined by substrate bias effect. As the thickness tox of the gate oxide film is thinned to suppress the roll-off of the threshold voltage, the substrate bias effect becomes weaker. Therefore, it is necessary that the impurity concentration of the channel body is increased to secure the enough signal amount $\Delta Vth$. In conclusion, securing the large signal amount is incompatible with improving characteristics of data holding.

Therefore, in the following embodiments, the memory cell is composed of a full depletion type MISFET so as to suppress the leak current in a scale-down and secure good characteristics of data holding. In the full depletion type MISFET, the impurity concentration and the thickness of the channel body is set such that the channel body is fully depleted when a voltage is applied to the gate to form the channel. Such a MISFET is referred to as an FD-type MISFET hereinafter. In the memory cell having such an FD-type MISFET, a state, in which the channel body is fully depleted by the electric field from a main gate and the majority carriers can be accumulated in a portion of a second side of the channel body by electric field from an auxiliary gate, is regarded as a thermal equilibrium state. Then, the memory cell can be stored dynamically a first data state in which the majority carriers are accumulated in the portion of the second side of the channel body and a second data state in which the majority carriers in the portion of the second side of the channel body are emitted.

First Embodiment

Figures 4A, 4B:
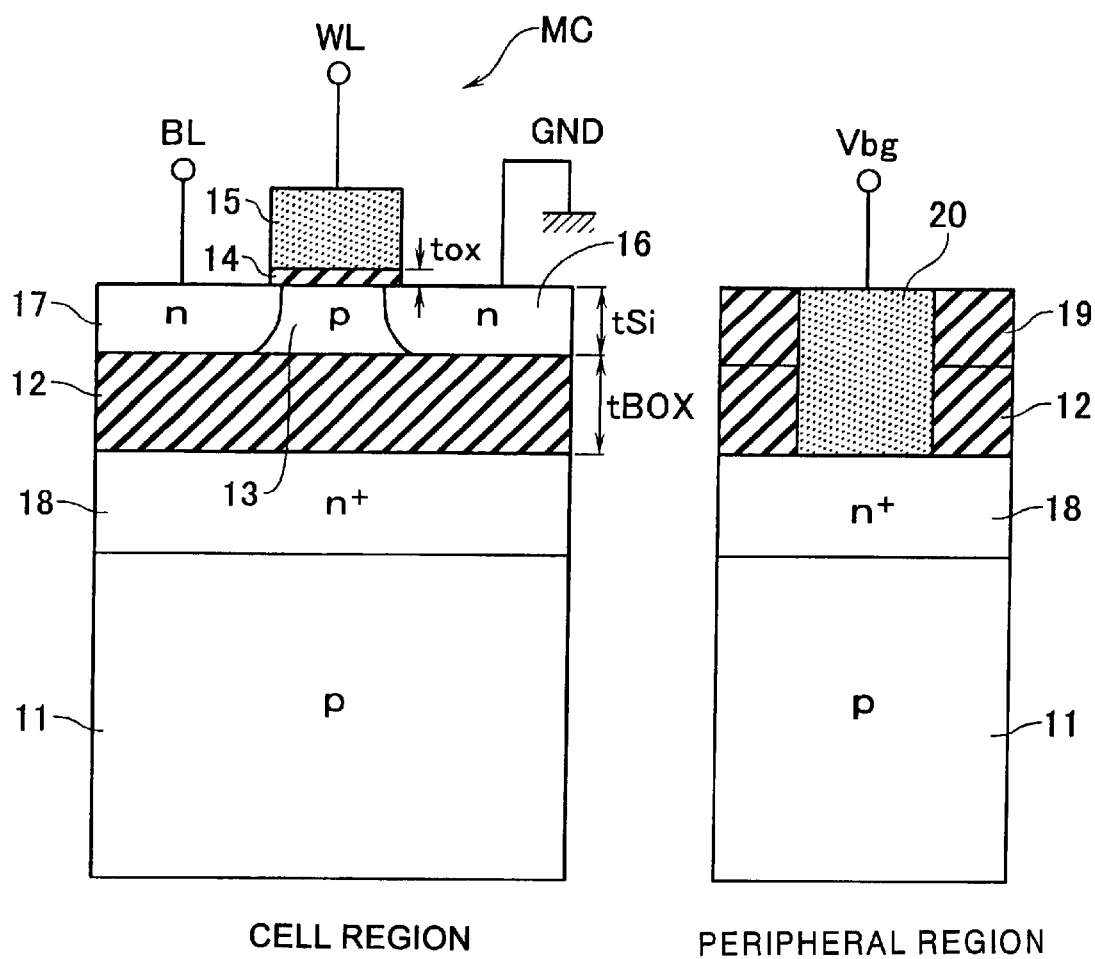
Fig. 4A is a diagram showing a structure of the memory cell using an FD-type MISFET according to a first embodiment (cell region)
FIG. 4B is a diagram showing the structure of the memory cell using the FD-type MISFET according to the first embodiment (peripheral region)

FIGS. 4A and 4B show a memory cell structure according to a first embodiment using the FD-type MISFET. The memory cell MC has an SOI substrate in which an insulating film 12 like a silicon oxide film is formed on a silicon substrate 11 and a p-type silicon layer 13 is formed on the insulating film 11. Since the insulating film 12 is buried under the silicon layer 13, the insulating film 12 is referred to as a BOX (buried oxide) layer hereinafter. The memory cell MC is an n-channel MISFET and it has a main gate 15 formed on the p-type silicon layer 13 via a gate insulating film 14 and source and drain diffusion regions 16 and 17 which are formed with a self-aligned process using the main gate 15 and reach to the bottom of the silicon layer 13.

As described in the concrete later, the p-type silicon layer 13 has an acceptor concentration NA and a thickness such that it is fully depleted when a gate voltage is applied to the main gate 15 to form a channel in its surface. More specifically, the thickness of the depletion layer extended from the surface of the p-type silicon layer 13 can be expressed as $(4\,\epsilon_{si}\cdot\phi_F/q\cdot NA)^{1/2}$, where the $\phi_F$ is Fermi-potential and the $\epsilon_{si}$ is a dielectric constant of silicon. Thus, condition of the full depletion type MISFET is $(4\,\epsilon_{si}\cdot\phi_F/q\cdot NA)^{1/2} > tSi$.

Furthermore, in the example of FIGS. 4A and 4B, the silicon substrate 11 is p-type and an n$^+$-type diffusion layer 18 is formed between the silicon substrate 11 and the BOX layer 12. The n$^+$-type diffusion layer 18 is an auxiliary gate to apply a predetermined electric field to the back face of the channel body composed of the p-type silicon layer 13 by capacitive coupling. The n$^+$-type diffusion layer 18 is formed as a common gate (back plate) at least throughout the cell array region. The case where a negative bias voltage is applied to the channel body from its back face is considered herein, so that the n$^+$-type diffusion layer 18 is formed as the auxiliary gate. However, the n$^+$-type diffusion layer 18 is not formed, but the silicon substrate 11 may be used as the auxiliary gate in itself. Or, a p$^+$-type diffusion layer may be formed as the auxiliary gate.

The memory cells MC are arranged in the form of a matrix so as to isolate each channel body from one another in a width direction in a floating state, too. The n$^+$-type diffusion layer 18 being the auxiliary gate is formed throughout the cell array region. In a peripheral region of the cell array region, the n$^+$-type diffusion layer 18 is connected to an auxiliary gate terminal thereabove via a contact plug 20, which is a polysilicon or the like and embedded in the BOX layer 12 and an interlayer insulating film 19 formed on the n$^+$-type diffusion layer 18.

In one of the concrete examples, the gate length is L=70 nm, the thickness of the gate insulating film 14 is tox=10 nm, the acceptor concentration of the p-type silicon layer 13 (channel body) is NA=$1.0 \times 10^{15}$ cm$^{-3}$, approximately. This acceptor concentration is very low. The thickness of the silicon layer 13 is tSi=25 through 50 nm, approximately. The BOX layer 12 has the thickness of 30 through 50 nm, and it is relatively thin in order to be easy to apply the electric field to the channel body from its back face.

Figure 5:
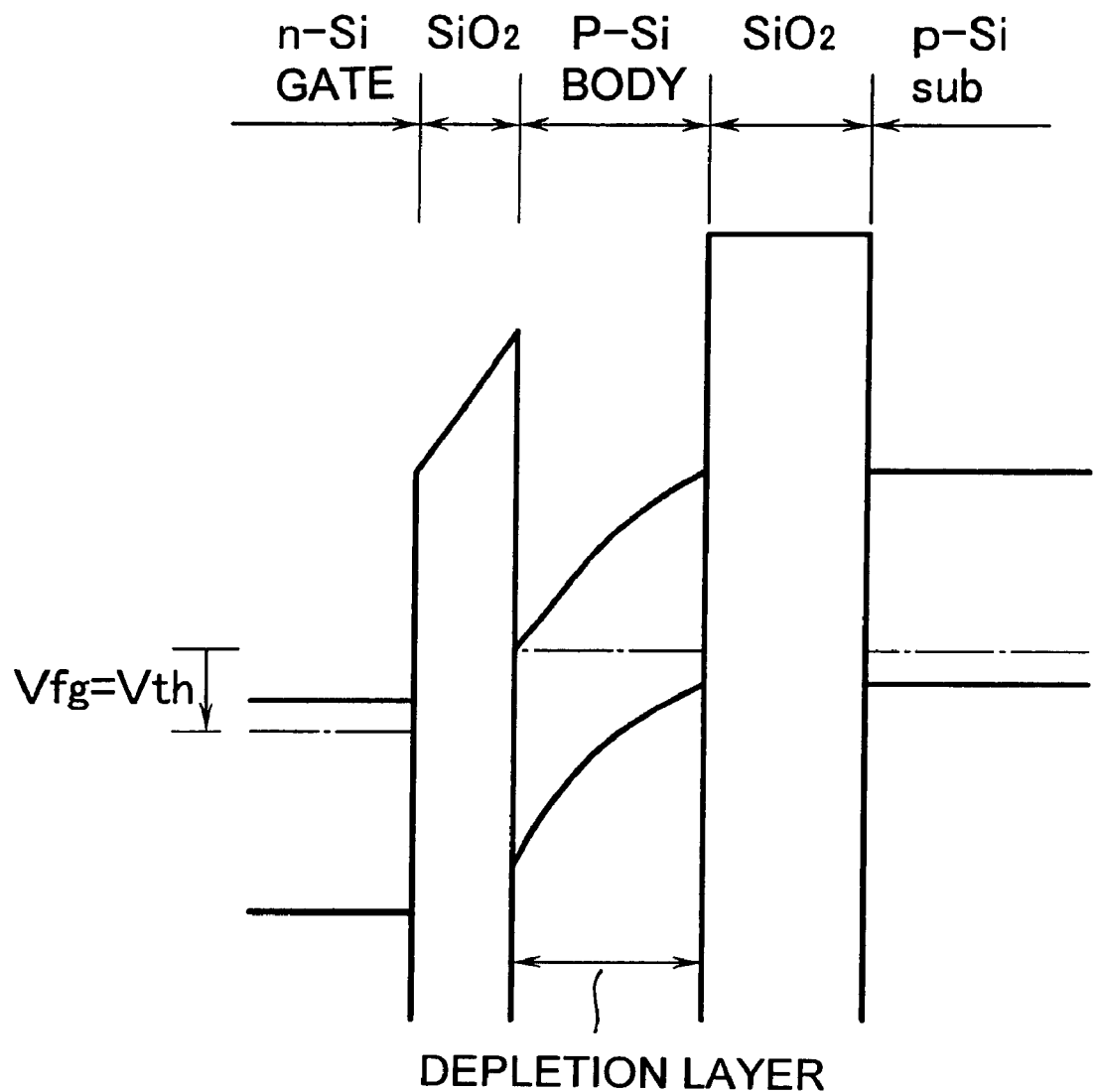
FIG. 5 is a diagram showing a basic band structure of the memory cell.
Figure 6:
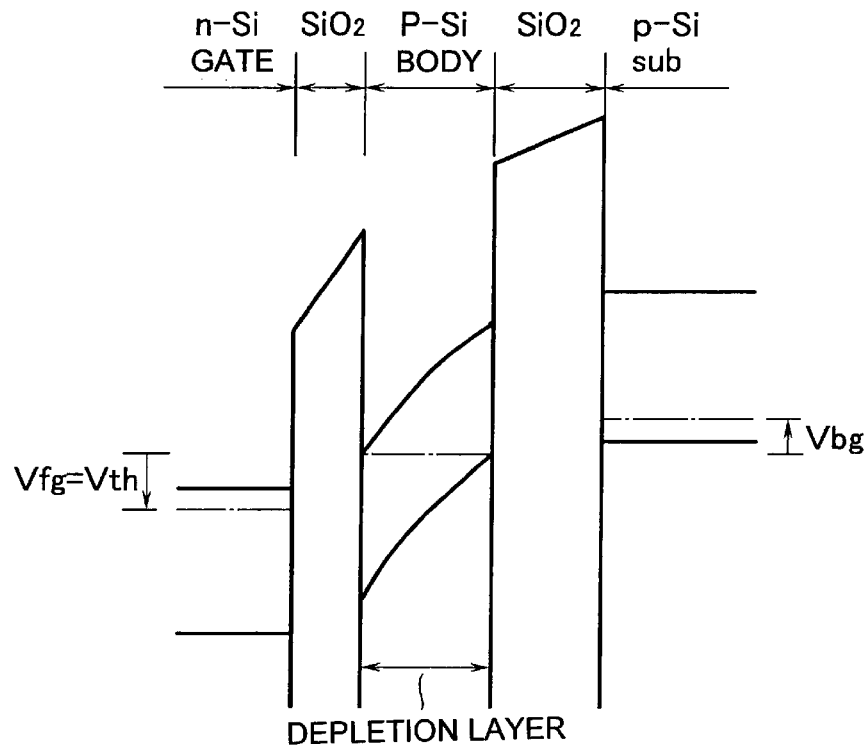
FIG. 6 is a diagram showing the band structure of the memory cell in a "0" state.

The memory cell under this condition becomes the FD-type MISFET. FIG. 5 shows a band structure when a surface channel is formed by contrast with FIG. 3. As shown in FIG. 5, the channel body is fully depleted when the voltage applied to the main gate is Vfg=Vth. However, this diagram shows the case where the p-type silicon substrate 11 directly contacts on the BOX layer 12. Under the circumstance that such a full depletion condition is met, a bias voltage Vbg is applied to the channel body from the auxiliary gate, so that a state in which holes can be accumulated in the portion of the back side face of the channel body fully depleted is established. In other words, the channel body is fully depleted by the electric field from the main gate and then the bias voltage Vbg is applied to the channel body by the auxiliary gate to realize the state in which a hole accumulating layer (p-type accumulated layer) is formed in the portion of the back side face of the channel body. FIG. 6 shows this state by contrast with FIG. 5.

As shown in FIG. 6, the voltage Vfg on the main gate and the voltage Vbg on the auxiliary gate fully deplete the channel body to form the state in which holes can be accumulated in the bottom portion of the channel body, and then this state is regarded as the "0" state of the memory cell. As time passed by, this "0" state is moved into a thermal equilibrium state in which holes are accumulated in the bottom portion of the channel body, and then it is defined as the "1" data holding state. For writing the "0" data, a forward current is sent between the drain region and the channel body to form a state in which the holes in the channel body are emitted (that is, a non-equilibrium state in which the channel body is fully depleted). For writing the "1" data in the "0" data cell, the impact ionization is generated by a pentode operation to form a state in which the holes are accumulated in the bottom of the channel body.

Next will be consideration to the threshold voltage of the memory cell according to this embodiment. Under the state in which the silicon layer 13 is fully depleted by electric field from the main gate, when the voltage Vbg is supplied to the auxiliary gate to lower the potential of the back face of the silicon layer 13 contacted to the BOX layer 12, the state accumulating the majority carriers (the holes in this case) can be obtained. Since there is no capacitive coupling from the auxiliary gate to the channel body because of fixed potential of the back face of the silicon layer 13, the threshold voltage Vthacc of the surface channel of the MISFET in this state is expressed by the following equation (1).

$$Vthacc = \phi_{FB} + (1 + Csi/Cox) \cdot 2\phi_F - Qdep/2Cox - (Csi/Cox) \cdot \phi bs \quad (1)$$

Where, the $\phi_{FB}$ is a flat band voltage between the main gate 15 formed of the n-type polysilicon and the p-type silicon layer 13 (channel body) in the MOS structure, the $\phi_F$ is Fermi-potential, the $\phi bs$ is a potential of the back face of the channel body, the Csi is a capacitance of the channel body (=$\epsilon$s/tSi), the Cox is a capacitance of the gate insulating film (=$\epsilon$ox/tox) and the Qdep is a space charge amount of the channel body fully depleted (=$-q \cdot NA \cdot tSi$).

On the other hand, under the sate in which the auxiliary voltage Vgb necessary for accumulating the majority carriers (holes) in the back face of the silicon layer 13 is not applied to the channel body, since the silicon layer 13 is fully depleted, the threshold voltage of the surface transistor has influence of the capacitive coupling by the auxiliary gate from the back face of the silicon layer 13. Namely, the threshold voltage is changed depending on the thickness tBOX of the BOX layer 12 and the value of the auxiliary gate voltage Vbg. If the threshold voltage in this case is Vthdep, it is expressed by the following equation (2).

$$Vthdep = Vthacc - (Cbox/Cox)/(1 + Cbox/Csi) \cdot (Vbg - Vbgacc) \quad (2)$$

Here, the voltage Vbgacc is a value of the auxiliary gate voltage Vbg necessary for accumulating the majority carriers in the portion of the back face of the silicon layer 13, and it is expressed by the following equation (3).

$$Vbgacc = \phi_{FB} - Csi/Cbox \cdot 2\phi_F - Qdep/2Cbox + (1+Csi/Cbox) \cdot \phi bs \quad (3)$$

Where, the φbs is a potential of the back face of the silicon layer 13. However, in the thermal equilibrium state in which the majority carriers (holes) are accumulated and settled, the φbs is 0 V. This state is a stable state obtained by applying the voltage necessary for fully depleting the silicon layer 13 to the main gate and the voltage Vbgacc to the auxiliary gate. In other words, this is also a state in which the "1" data is written with the pentode region operation of the memory cell and the generation of the majority carriers.

On the other hand, in the state in which the "0" data is written, specifically, in the state shifted from the thermal equilibrium state by forwardly biasing the pn junction between the bit line and the channel body and then emitting the majority carriers (holes) accumulated, the potential φbs of the portion of the back face of the silicon layer 13 is not 0 V but negative value. In this state, the potential bs of the back face of the silicon layer 13 in the "0" data state is assumed to be φbs0 = −1.57×φ_f in accordance with the result of the device simulation.

If a relation between the threshold voltage Vth and the auxiliary gate voltage Vbg is found out using the equations mentioned above, the result of FIG. 7 can be obtained, where tox=10 nm, tBOX=30 nm, tSi=25 nm, NA=1.0×10$^{15}$ cm$^{-3}$ and temperature is room one.

Figure 7:
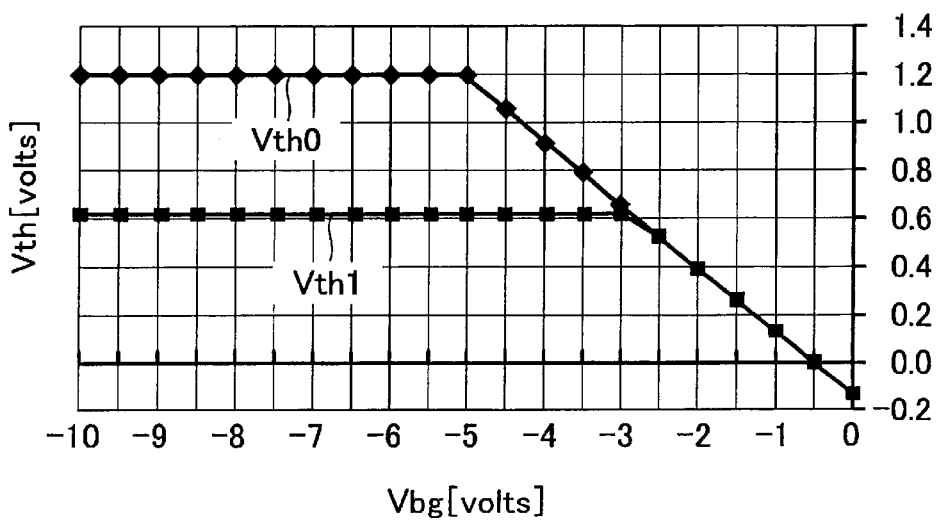
FIG. 7 is a graph showing a relation between a threshold voltage and an auxiliary gate voltage of the memory cell holding "0" data and "1" data.

As shown in FIG. 7, when the Vbg is in the positive side more than −3V, since the majority carriers are not accumulated in the portion of the back face of the silicon layer 13, the channel body is fully depleted and a memory function is not realized. Specifically, even if the "1" data writing operation is performed and the majority carriers are generated, the majority carriers are not accumulated and then they are emitted to the source region 16 or the drain region 17 immediately.

As the Vbg goes to negative side more than −3V, the majority carriers (holes) can be accumulated by the electric field from the auxiliary gate side and the memory function can be realized gradually. From another viewpoint, this means that the memory cell structure keeps the stable state (full depletion state) in which the non-equilibrium state cannot exist when the Vbg is larger than −3V whereas the memory cell structure is in unstable state in which the non-equilibrium state can exist when the Vbg is more negative than −3V. It can be said that a system including this non-equilibrium state is used as the DRAM cell in this embodiment. That is, the state to hold the "1" data is the thermal equilibrium state. The "0" data state (in which threshold voltage Vth is high) is the non-equilibrium state in which at least a part of the accumulated majority carriers is emitted, and this state is the unstable state which will return to the "1" data if it is held for a long time.

If a memory operation is performed in a state where the auxiliary gate voltage Vbg is low enough and the majority carriers are accumulated for the "0" data and the "1" data, the signal amount ΔVth is expressed by the following equation (4) on the basis of the equation (1).

$$\Delta Vth = (Csi/Cox) \cdot \Delta \phi bs \quad (4)$$

Here, the Δφbs is a potential difference in back face of the silicon layer 13 between the "0" data state and the "1" data state. Thereby, it is understood that the ratio of the Csi to the Cox namely tox/tsi may be larger or the Δφbs may be larger in order to increase the signal amount. The former is condition of the device structure and the latter means signal becomes large if the potential of the bit line is negative enough on the "0" data writing operation.

As being apparent from the equation (4), in the memory cell according to this embodiment, the signal amount does not depend on the impurity concentration of the channel body, and it is different from the memory cell using the PD-type MISFET. The conditions that the signal amount increases as the Cox is smaller namely the thickness tox of the gate oxide film is thicker is the same. However, the PD-type MISFET has a large short channel effect, so that the tox cannot be thickened.

In contrast, in this embodiment using the FD-type MISFET, since the short channel effect is greatly improved, the tox can be thickened. Furthermore, viewed in the structure, the fact that the signal amount depends on only tox/tsi means that the signal amount can be kept constant if this ratio remains even though the channel length is more shortened in the future. Hence, it indicates that the scale-down is possible.

The followings are an actual result of the two-dimensional device simulation for verification of the memory operation. The device parameters are the gate length L=70 nm, the gate oxide film thickness tox=10 nm, the BOX layer thickness tBOX=30 nm, the silicon layer thickness tsi=25 nm, the acceptor concentration NA=1.0×10$^{15}$ cm$^{-3}$ and the Vbg=−5V.

Figure 8:
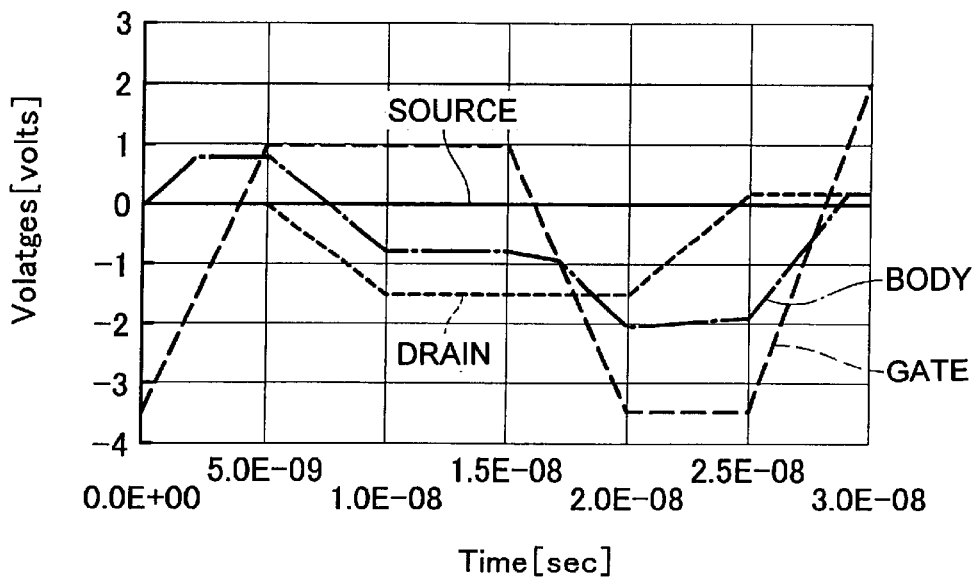
FIG. 8 is a graph showing an operation waveform of "0" data write/read of the memory cell.
Figure 9:
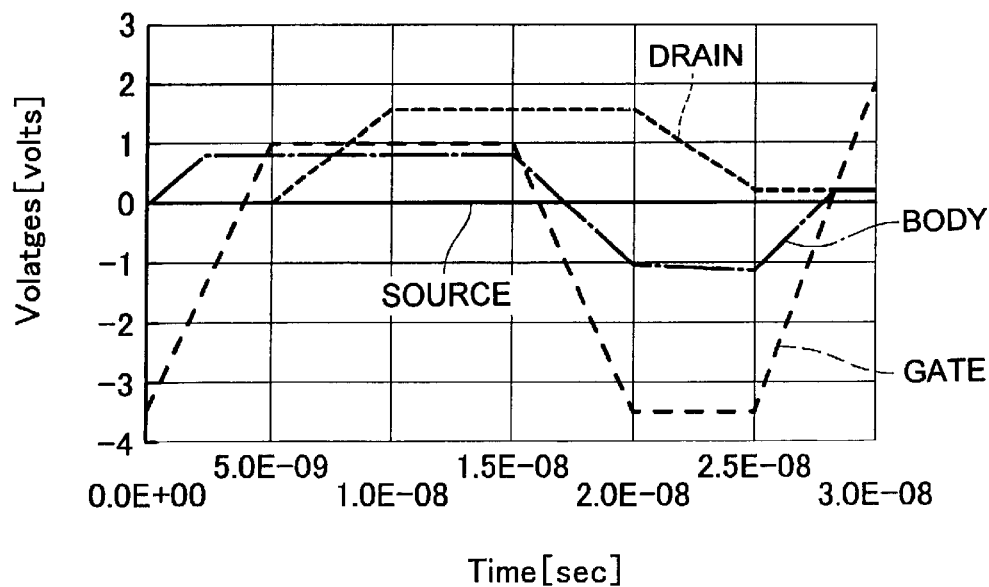
FIG. 9 is a graph showing an operation waveform of "1" data write/read of the memory cell.

FIG. 8 shows a diagram in the case where the "0" read operation subsequent to the "0" write operation is performed, and FIG. 9 shows a diagram in the case where the "1" read operation subsequent to the "1" write operation is performed. As shown in FIG. 8, the gate voltage is raised from −4V to 1V, and next, the drain voltage is lowered from 0V to −1.5V, so that the "0" data write operation is performed. Then, the gate voltage is returned to −4V and the drain voltage is returned to approximately 0V at timing of 2.5E−08. This timing indicates the data holding state and then the read operation is performed with raising the gate voltage again.

As shown in FIG. 9, the gate voltage is raised from −4V to 1V, and next, the drain voltage is raised from 0V to 1.5V, so that the "1" data write operation is performed. Then, the gate voltage is returned to −4V and the drain voltage is returned to approximately 0V at timing of 2.5E−08. This timing indicates the data holding state and then the read operation is performed with raising the gate voltage again. The source voltage (fixed potential line voltage) is 0V in both cases.

Figure 10:
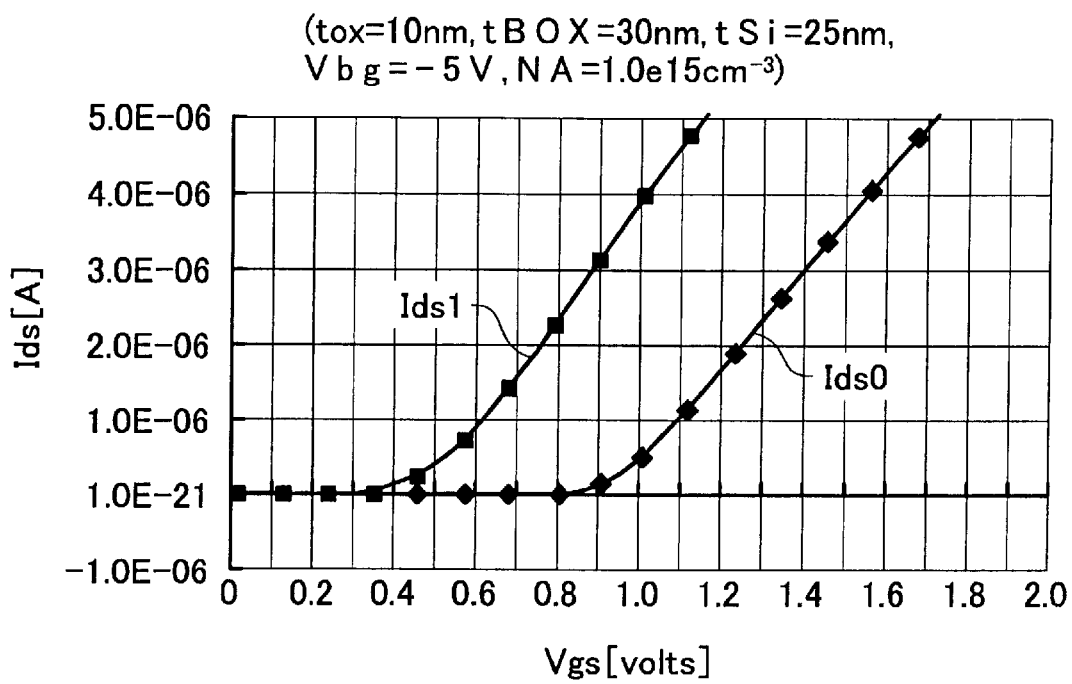
FIG. 10 is a graph showing characteristics between a drain current and a gate voltage in a read operation of the memory cell.

In FIGS. 8 and 9, the body potential indicates quasi-Fermi potential of holes in the center of the channel body (in the center of the channel length direction and the silicon depth direction). FIG. 10 is a diagram showing characteristics of the drain current Id versus gate voltage Vgs of the "0" data read operation and "1" data read operation, where Ids0 indicates characteristics of the "0" data read operation and Ids1 indicates characteristics of the "1" data read operation.

Judging from the above-result, it is understood that the enough signal amount can be secured because the signal amount ΔVth is approximately 500 mV in the data read operations.

Figure 11:
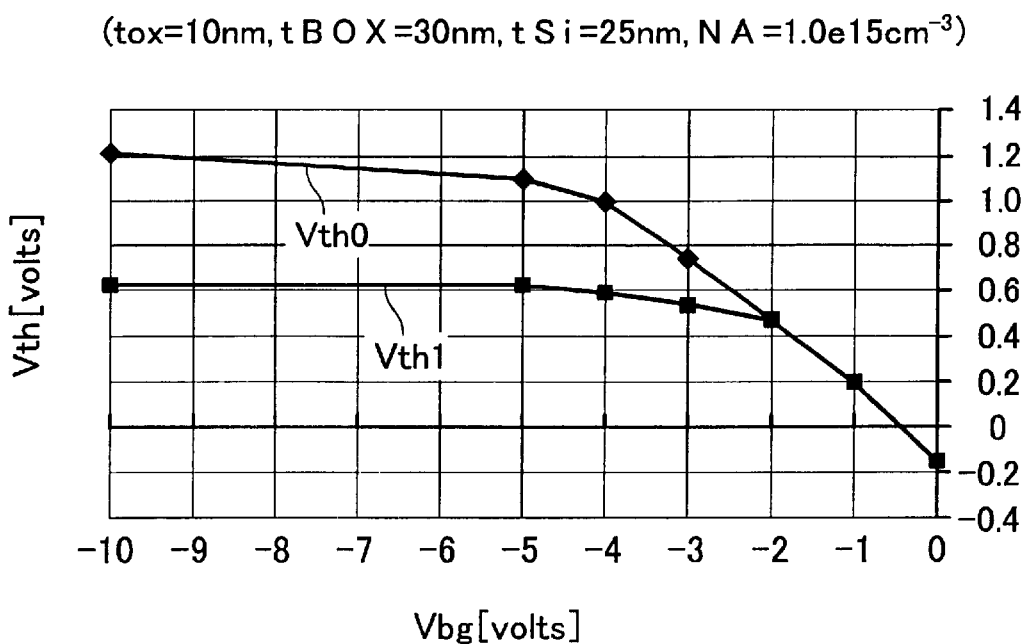
FIG. 11 is a graph showing a relation between the threshold voltage and the auxiliary gate voltage of the memory cell holding "0" data and "1" data.

FIG. 11 shows a dependency of the auxiliary gate voltage Vbg concerning the Vth0 in the "0" data and the Vth1 in the "1" data, and this is obtained by the same device simulation with the auxiliary gate voltage Vbg changed. This coincides with FIG. 7 of theoretical calculation.

Second Embodiment

Figures 12A, 12B:
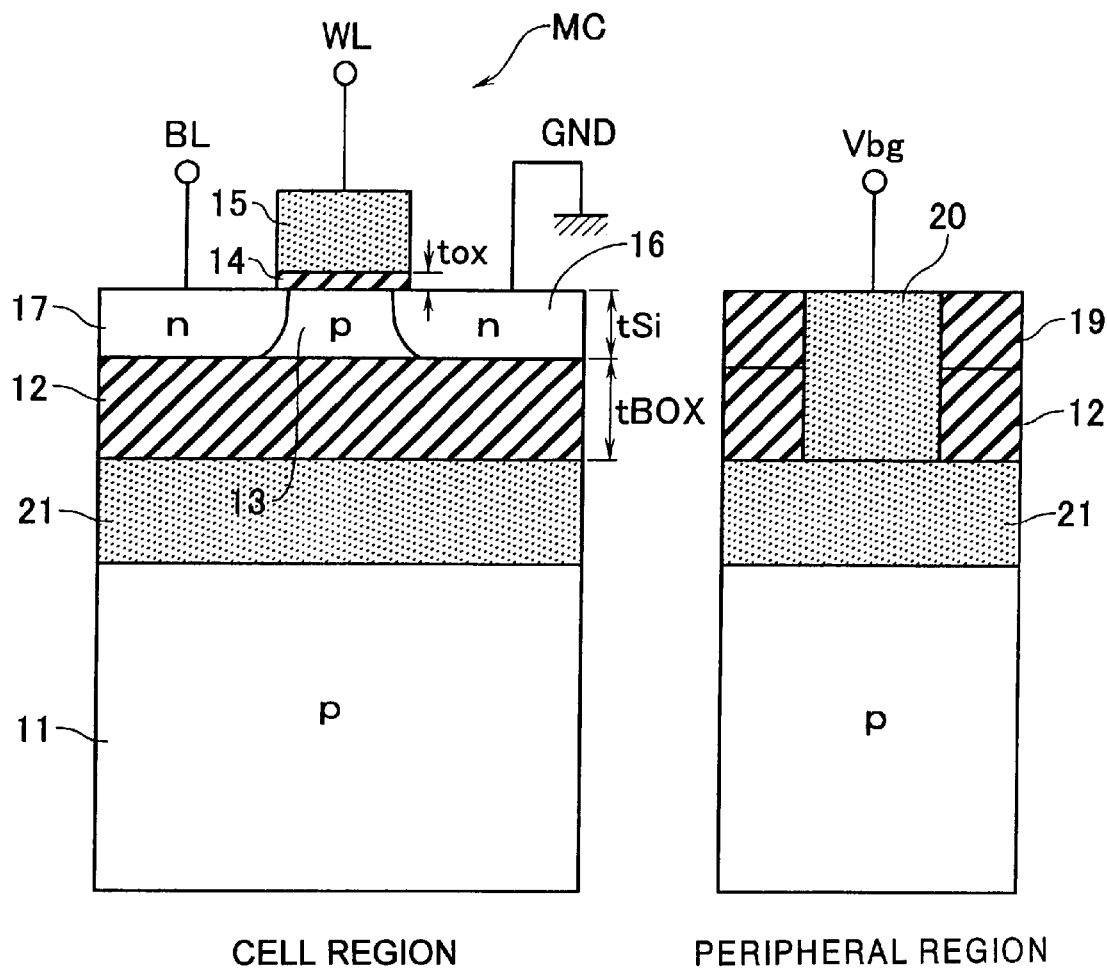
FIG. 12A is a diagram showing a structure of a memory cell according to a second embodiment (cell region)
FIG. 12B is a diagram showing the structure of the memory cell according to the second embodiment (peripheral region)

FIGS. 12A and 12B shows a sectional structure of a memory cell MC according to a second embodiment by contrast with FIGS. 4A and 4B. In this embodiment, a p+-type polysilicon layer 21 is buried under the BOX layer 12 as the auxiliary gate instead of the diffusion layer 18. In other words, the p+-type polysilicon layer 21 is an impurity doping layer between the semiconductor substrate 11 and the silicon layer 13. The p+-type polysilicon layer 21 may be formed as a common electrode at least throughout the cell array region.

Third Embodiment

Figures 13A, 13B:
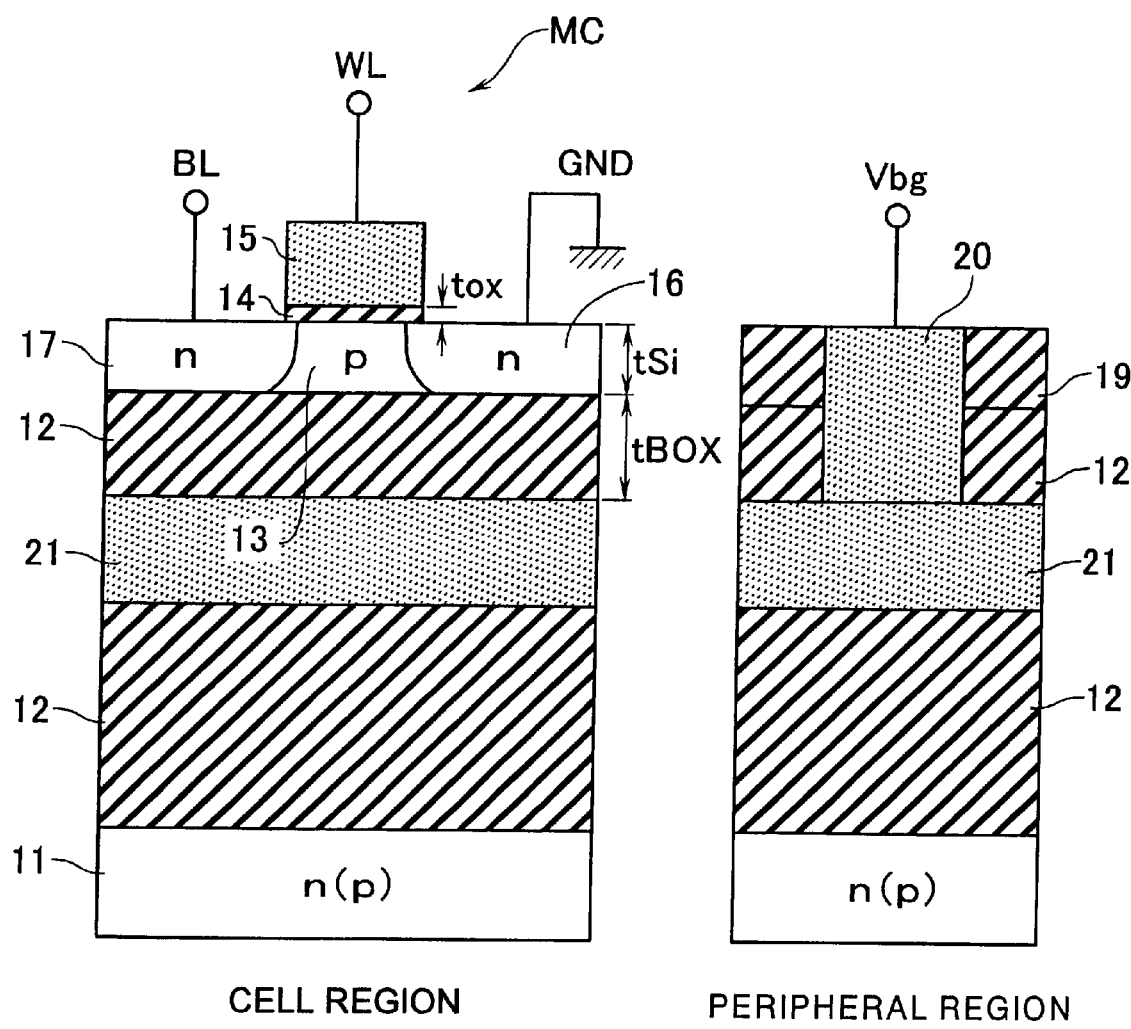
FIG. 13A is a diagram showing a structure of a memory cell according to a third embodiment (cell region)
FIG. 13B is a diagram showing the structure of the memory cell according to the third embodiment (peripheral region)

FIGS. 13A and 13B show a memory cell structure according to a third embodiment by contrast with FIGS. 12A and 12B. In this embodiment, the BOX layer 12 is thicker, and the polysilicon layer (impurity doping layer) 21 is buried in the BOX layer 12 as the auxiliary gate. In this case, the p+-type polysilicon layer 21 may be formed as a common electrode at least throughout the cell array region.

Fourth Embodiment

Figures 14A, 14B:
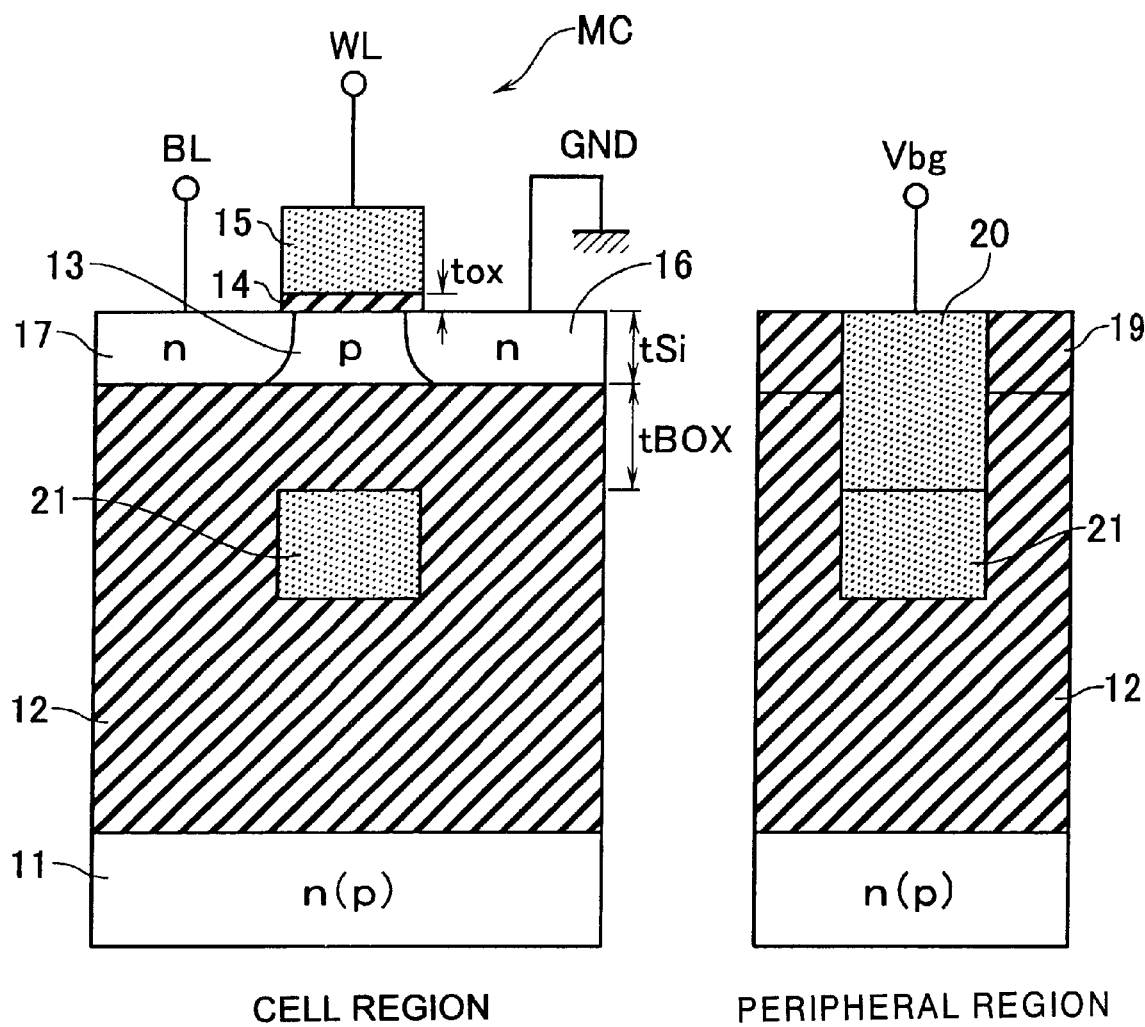
FIG. 14A is a diagram showing a structure of a memory cell according to a fourth embodiment (cell region)
FIG. 14B is a diagram showing the structure of the memory cell according to the fourth embodiment (peripheral region)

FIGS. 14A and 14B shows a memory cell structure according to a fourth embodiment in which the structure of FIGS. 13A and 13B is slightly modified. In this embodiment, the polysilicon layer 21 buried in the BOX layer 12 is formed as a plate line (auxiliary word line) in the stripe form in parallel with the word line WL composed of the gate electrode 15. The polysilicon layer 21 is connected to a supply terminal of the auxiliary gate voltage Vbg via the contact plug at the end portion of the word line direction, for example, at the end portion opposite to the side where a word line driver is arranged.

In addition, the structure shown in FIGS. 14A and 14B in which the auxiliary gates are separated from one another can be also applied to the diffusion layer 18 in FIGS. 4A and 4B of the first embodiment, the polysilicon layer 21 in FIGS. 12A and 12B and FIGS. 13A and 13B of the second and third embodiments.

Fifth Embodiment

Figure 15:
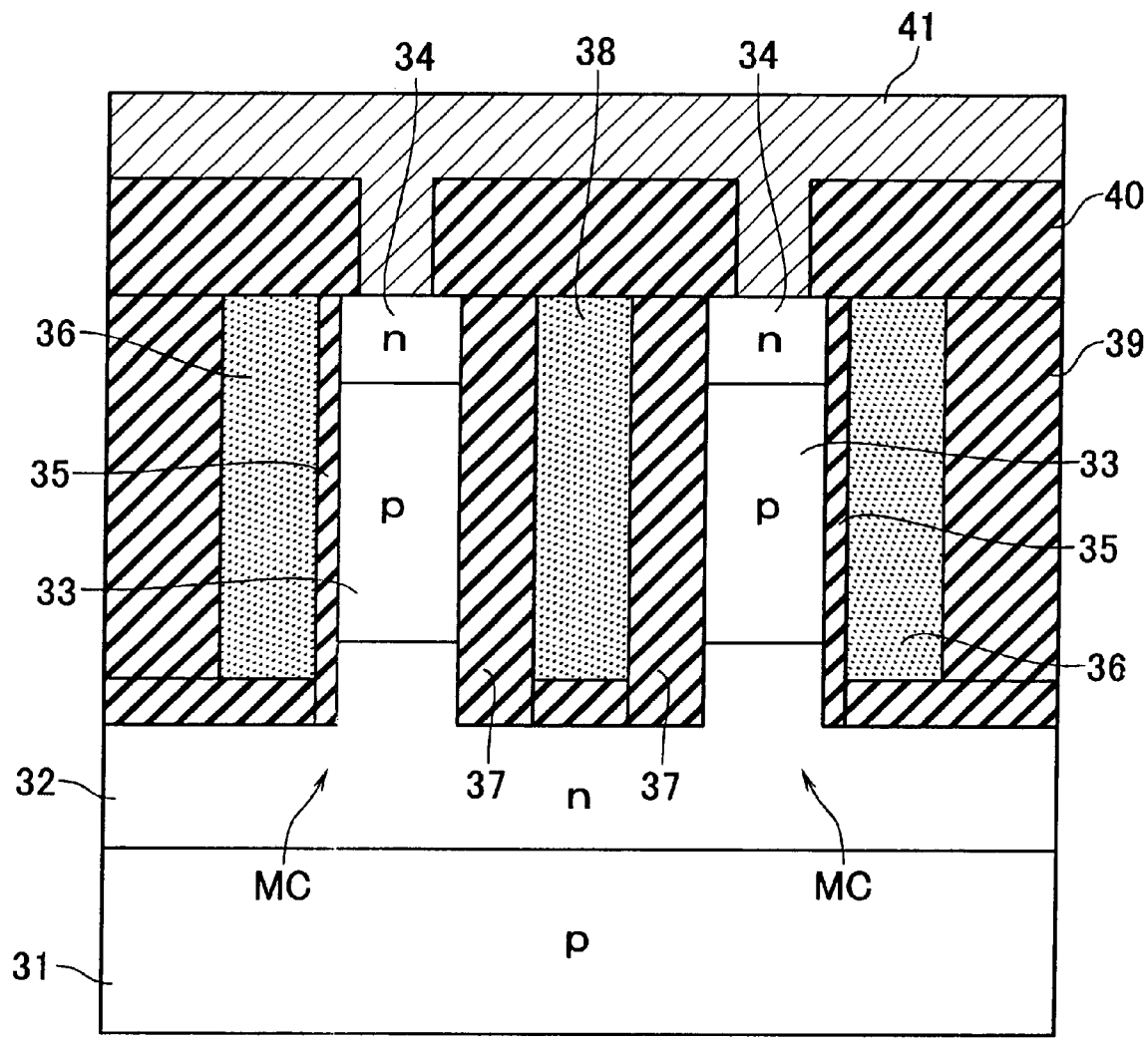
FIG. 15 is a diagram showing a structure of a memory cell according to a fifth embodiment.

In the embodiments mentioned above, although a lateral transistor in which the channel is formed in parallel with the substrate face is used as the MISFET, a vertical transistor in which the channel is formed perpendicular to the substrate face may be used. A sectional structure of a portion of two memory cells in such a manner is shown in FIG. 15.

An n-type layer 32 is formed on an entire surface of a p-type silicon substrate 31, pillar shaped p-type silicon portions 33 are patterned and formed in each memory cell region on the n-type silicon layer 32. The p-type silicon layer 32 is a common source for all the memory cells. A main gate 36 is formed via a gate insulating film 35 on the one vertical side of the silicon portion 33 whereas an auxiliary gate 38 is formed via a gate insulating film 37 on the other vertical side thereof. Here, the case where the auxiliary gate 38 is shared by neighboring memory cells MC is shown. The main gate 36 and the auxiliary gate 38 are continuously formed in one direction in parallel as a word line WL and a plate line PL, respectively. A drain diffusion region 34 is formed in the top portion of each p-type silicon portion 33. A bit line 41 connected to each drain region 34 is provided on an interlayer insulating film 40.

In this embodiment, the thickness of the p-type silicon portion 33 (width of lateral direction in this drawing) and the impurity concentration is chosen so as to be the FD-type MISFET, thereby the same operation as the above-mentioned embodiments can be realized.

Sixth Embodiment

Figures 16A, 16B:
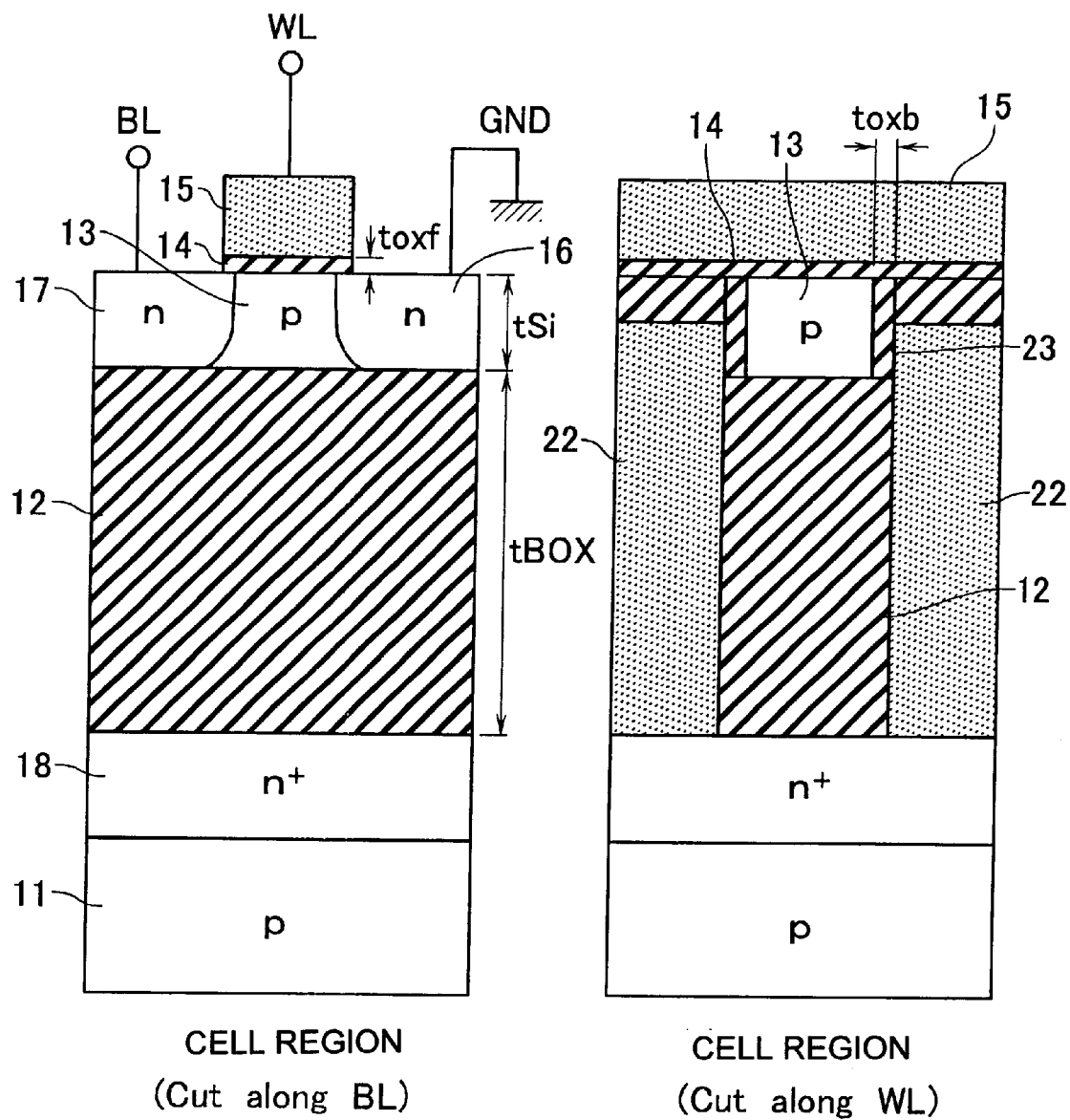
FIG. 16A is a diagram showing a structure of a memory cell according to a sixth embodiment (sectional view taken along a bit line BL)
FIG. 16B is a diagram showing the structure of the memory cell according to the sixth embodiment (sectional view taken along a word line WL)

FIGS. 16A and 16B also show sectional views of a vertical MISFET, however, the auxiliary gate for controlling the potential of the portion of the back side face of the channel body is not directly opposite to the back side face thereof, but a pair of auxiliary gates are opposite to each other at the bottom portion of the both side faces. It is the same as FIGS. 4A and 4B that the n+-type diffusion layer 18 is formed under the BOX layer 12, but the BOX layer 12 is thicker. Therefore, as shown in FIG. 16B showing the sectional view taken along the word line WL, polysilicon portions 22 are buried in the BOX layer 12 so as to be opposite to each other via gate insulating films 23 in the bottom portion of the p-type silicon layer 13. In this embodiment, the polysilicon portions 22 are buried on both sides of the p-type silicon layer 13, and the bottom of the polysilicon portions 22 are connected to the n+-type diffusion layer 18. As a result, the polysilicon portions 22 are auxiliary gates for controlling a potential of the bottom portion of the p-type silicon layer 13 with capacitive coupling.

In this embodiment, it is verified by the simulation that the same memory operation as the above-mentioned embodiments can be realized. The followings are a result of a three-dimensional device simulation. Parameters are that the gate length L and gate width W are 0.175 μm, the gate oxide film thickness toxf of the main gate 15 side is 6.5 nm, the acceptor concentration NA of the channel body is $1.0 \times 10^{15}$ cm$^{-3}$, both the main gate 15 and the auxiliary gate 22 are the n+-type polysilicon, the auxiliary gate voltage Vbg is −4V, the gate oxide film thickness toxb of the auxiliary gate side is 15 nm, the thickness tSi of the silicon layer 13 is 140 nm and the BOX layer thickness is 200 nm. The polysilicon portions 22 are buried up to the middle height of the channel body.

Figure 17:
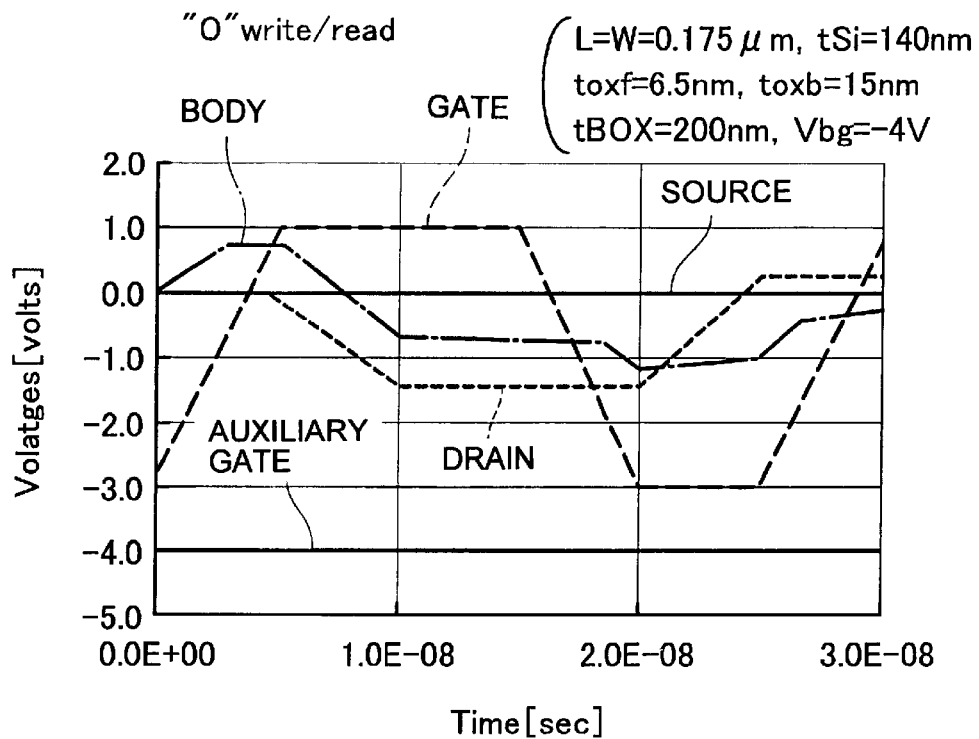
FIG. 17 is a graph showing an operation waveform of "0" data write/read of the memory cell.
Figure 18:
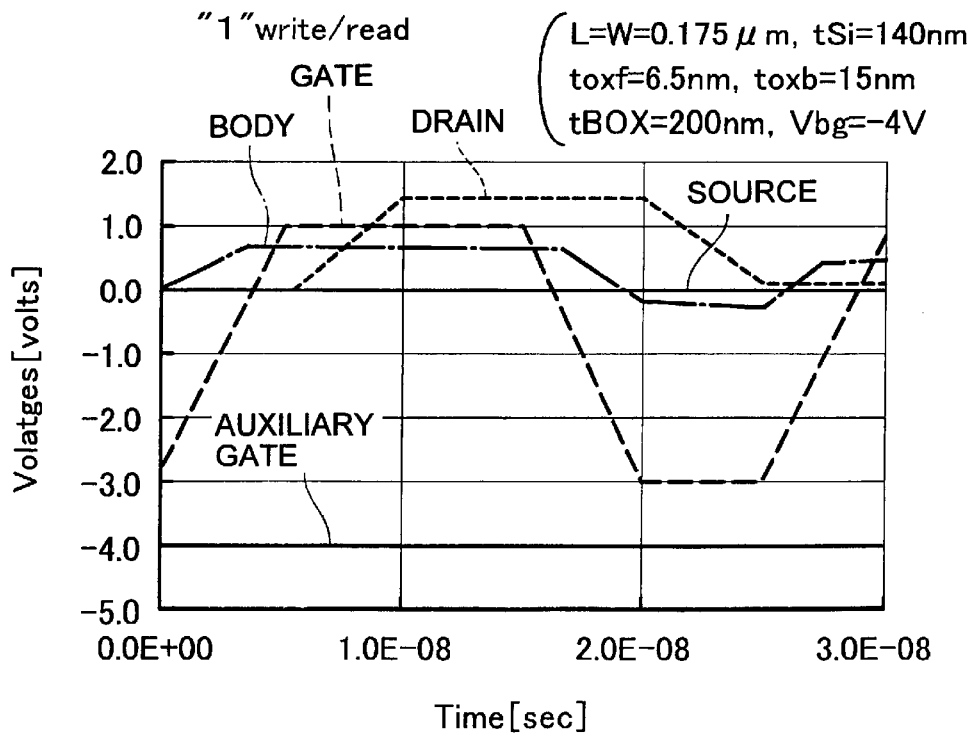
FIG. 18 is a graph showing an operation waveform of "1" data write/read of the memory cell.
Figure 19:
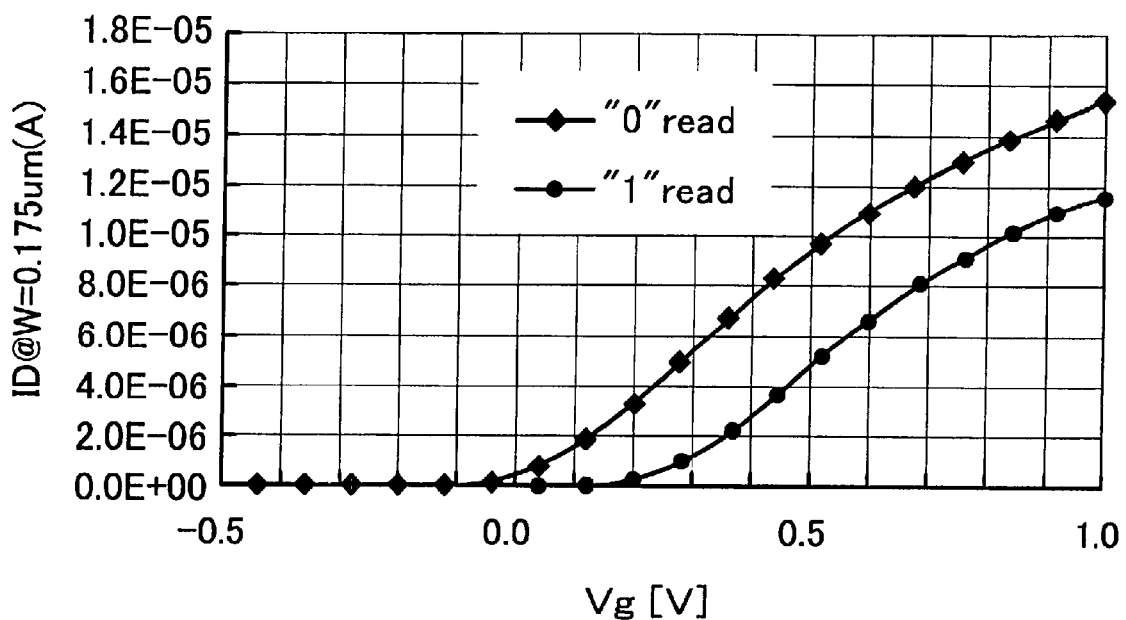
FIG. 19 is a graph showing characteristics between a drain current and a gate voltage in a read operation of the memory cell.

FIGS. 17 and 18 show operating waveforms of the "0" data write/read and the "1" data write/read and correspond to FIGS. 8 and 9 in the first embodiment, respectively. FIG. 19 shows characteristics of the drain current Ids versus the gate voltage Vgs in the read operation and corresponds to FIG. 10. In this embodiment, the signal amount ΔVth=250 mV.

A MISFET Having an Intrinsic Silicon as the Channel Body

In the above-mentioned embodiments, n-channel MISFET having the channel body of p-type silicon is used. On the other hand, it is possible that a MISFET having the channel body of an intrinsic silicon which does not substantially include impurity. That way, there is no leak current caused by crystalline unconformity in the channel body because of impurity diffusion and so on, so that data holding characteristics are improved further. In order that the threshold voltage Vth of the MISFET is positive, it is necessary to use p+-type polysilicon for the main gate. However, even if the threshold voltage is negative, it is enough that the operation is performed in the condition that the word line level is lowered by approximately 1V, so that an n+-type polysilicon may be used for the main gate.

Figure 20A:
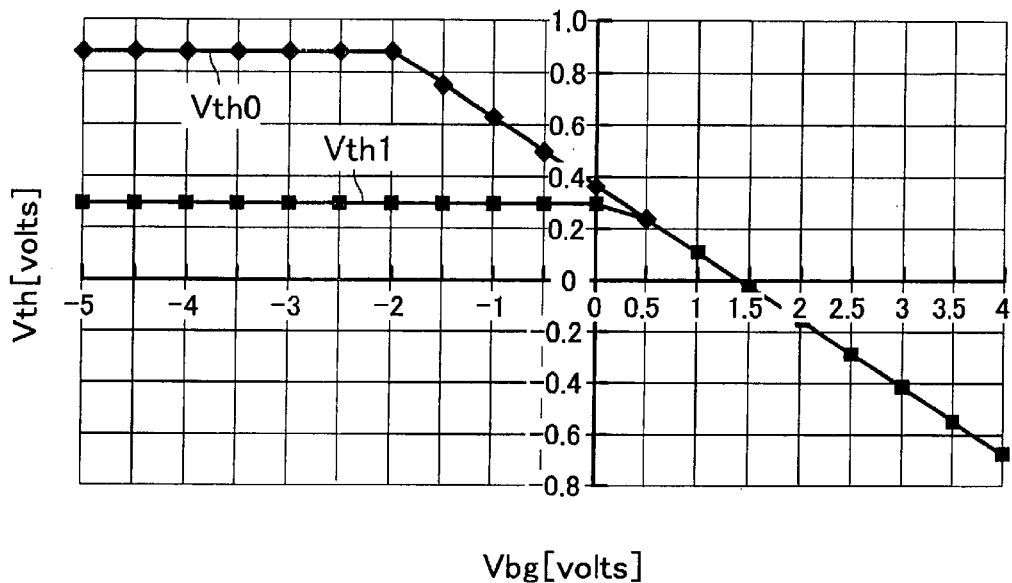
FIG. 20A is a graph showing a relation between a threshold voltage and an auxiliary gate voltage of the memory cell holding "0" data and "1" data, when an intrinsic silicon is used as the channel body.

FIG. 20A shows a calculation result of a relation of the threshold voltages Vth0 and Vth1 in the "0" data and "1" data versus the auxiliary gate voltage Vbg in the case where the intrinsic silicon is used as the channel body in the MISFET, by contrast with the FIG. 11. Here, the assumption is made that the p+-type polysilicon is used for the main gate.

The value of the auxiliary gate voltage Vbg must be in the negative side more than the value capable of accumulating the majority carriers in the channel body of the "1" data cell. Furthermore, if the value of the auxiliary gate voltage Vbg is in the negative side more than the value (Vbg=−2V in FIG. 20A) capable of accumulating the majority carriers in the channel body of the "0" data cell, the signal amount ΔVth is maximized. However, it is important that the electric filed in the junction between the drain and the source in the channel body in the "0" data cell is reduced in order to increase data holding time. From the viewpoint of this, it is preferable that the back face potential of the channel body in the "0" data cell is not lowered by a large amount in a negative direction but the channel body is in the full depletion state in which the majority carriers are not accumulated. For this purpose, the auxiliary gate voltage Vbg may be set between the value at which the majority carriers are accumulated in the channel body in the "1" data cell and the value at which the majority carriers are accumulated in the channel body in the "0" data cell. In accordance with the result of FIG. 20A in this embodiment, it is set in the range of −2.0V<Vbg<0.5V. However, if the data holding time is set longer than required specification, it is preferable that the voltage Vbg is set at the value smaller than the value capable of accumulating the majority carriers in the channel body in the "0" data cell and then the signal amount is maximized.

Fluctuation of Device Parameters in the Above-Mentioned Embodiments

Next, the following Table 1 shows characteristic changes owing to fluctuation of various device parameters when the DRAM according to the above-mentioned embodiment is manufactured.

TABLE 1

| sample No. | 0 | 1 | 2 | 3 | 4 | 5 | 6 |
|---|---|---|---|---|---|---|---|
| NA[cm$^{-3}$] | 1E+15 | 1E+15 | 1E+15 | 1E+15 | 1E+15 | 1E+15 | 1E+15 |
| tox[nm] | 10 | 10 | 10 | 10 | 10 | 8 | 12 |
| tBOX[nm] | 30 | 30 | 30 | 20 | 40 | 30 | 30 |
| tSi[nm] | 25 | 15 | 35 | 25 | 25 | 25 | 25 |
| Vbg0[V] | −5 | −7.5 | −4 | −4 | −6.5 | −5 | −5 |
| Vbg1[V] | −3 | −4.5 | −2.25 | −2 | −3.5 | −3 | −3 |
| Vbgs[V] | −4.5 | −6.75 | −3.56 | −3.5 | −5.75 | −4.5 | −4.5 |
| Vth0[mV] | 1050 | 1800 | 710 | 1100 | 1050 | 810 | 1290 |
| Vth1[mV] | 620 | 1100 | 410 | 610 | 610 | 490 | 780 |
| ΔVth[mV] | 430 | 700 | 300 | 490 | 440 | 320 | 510 |

In the Table 1, since the fluctuation of the channel length L and the acceptor concentration NA of the channel body has little influence, these changes are ignored. Except for this, to the changes of the gate oxide film thickness tox, the BOX layer thickness tBOX and silicon layer thickness tSi, the Vbg0 indicates the maximum auxiliary gate voltage necessary for accumulating the majority carriers (holes) in the channel body in the "0" data cell, whereas the Vbg1 indicates the maximum auxiliary gate voltage necessary for accumulating the majority carriers (holes) in the channel body in the "1" datacell. In addition, the actual setting voltage of the auxiliary gate voltage Vbgs is calculated by Vbgs=Vbg0+(Vbg1−Vbg0)×0.25, under the condition that the channel body is fully depleted on the "0" data holding on the basis of conditions for acquiring large signal amount. Table 1 further shows the threshold voltage Vth0 of the "0" data cell, the threshold voltage Vth1 of the "1" data cell and the difference ΔVth therebetween then.

As shown in Table 1, when the changing conditions are tox=10 nm±20%, tBOX=30 nm±33% and tSi=25 nm±40%, the optimum setting voltage Vbgs of the auxiliary gate is changed in the range of −3.5V through −6.75V. Moreover, the threshold voltage Vth0 of the "0" data cell is changed in the range of 710 mV through 1800 mV whereas the threshold voltage Vth1 of the "1" data cell is changed in the range of 410 mV through 1100 mV It must be important to suppress these changes. In the examples above, although the changes are intentionally emphasized, there is a possibility of the changes in the range of approximately ±10% in fact. In such a precondition, even if there are these changes, it is also important to adjust the auxiliary gate voltage Vbgs, a high level voltage VWLHW of the word line on the write operation, a voltage VWLHR of the word line on the read operation and a low level voltage VWLL of word line on the holding state, last three being necessary to be adjusted by the changes of the threshold voltages Vth0 and Vth1, through the chip selecting test. Since it can be considered that there is no these parameter changes in one chip, the adjusting (trimming) for each chip is enough. Or, the adjusting for wafer unit or lot unit may be enough in some cases. The influence on sense amplifiers in the read operation is unimportant, because the changes of the Vth are canceled each other as long as dummy cells having the same structure as the memory cell are used.

There are various method for the adjusting of the auxiliary gate voltage Vbgs and the above-mentioned word line potential VWLHW/VWLHR/VWLL. For instance, a test MISFET having the same structure as the memory cell is provided for each chip. When the chip selecting test is performed, the "0" data write/read operation and the "1" data write/read operation are performed to/from the test MISFET, and then the threshold voltages Vth0 and Vth1 are measured in a triode region of the test MISFET. The same tests are repeated with the auxiliary gate voltage Vbg changed, and the optimum auxiliary gate voltage Vbg is decided.

Figure 20B:
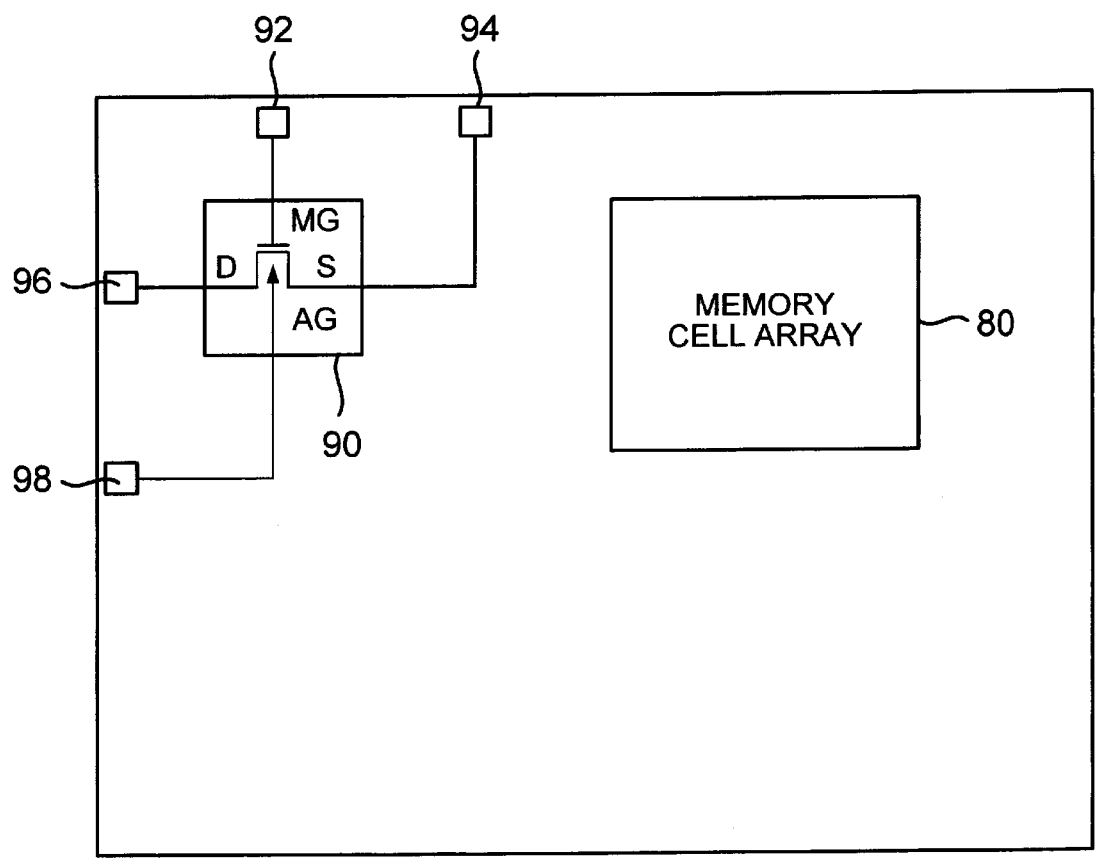
FIG. 20B is a block diagram showing a structure of a memory chip including a mimic transistor in addition to the memory cell array.

FIG. 20B is a diagram showing such a chip structure. As shown in FIG. 20B, the chip has a mimic transistor 90 in addition to a memory cell array 80. The mimic transistor 90 has the same structure as the memory cells MC in the memory cell array 80. However, there are difference points that its main gate MG, source region S, drain region D and auxiliary gate AG are connected to pads 92, 94, 96 and 98, respectively. That is, the chip has the pads 92, 94, 96 and 98 to test the mimic transistor 90.

Therefore, the main gate voltage Vfg can be directly applied to the main gate MG from the pad 92, and the auxiliary gate voltage Vbg can be directly applied to the auxiliary gate AG from the pad 98. Moreover, by measuring a current flowing between the pad 94 and the pad 96, a current flowing between the source region S and the drain region D of the mimic transistor 90 can be directly measured. As a result, it is possible to write the "1" data into the mimic transistor 90 and the "0" data into the mimic transistor 90. Furthermore, it is possible to easily measure the threshold voltage Vth1 of the "1" data write state and the threshold voltage Vth0 of the "0" data write state.

Since the chip has the mimic transistor 90 of this structure, it is possible to accurately measure what voltage the auxiliary gate Vbg, what voltage the high level voltage VWLHW of the word line on the write operation, the voltage VWLHR of the word line on the read operation and the low level voltage VWLL of word line on the holding state should be adjusted.

On the other hand, a nonvolatile memory circuit like fuses is mounted on the memory chip as an initial setting data memory circuit to initially set operation conditions. Then, in accordance with the result of the above-mentioned test, the fuses are programmed. The programmed data are read when power is turned on, an auxiliary gate voltage setting circuit, a word line voltage generating circuit and so on for VWLHW/VWLHR/VWLL are initially set. In this manner, it is possible to set the optimum operation condition for each memory chip.

Cell Array Structure in the First Embodiment

Figure 21:
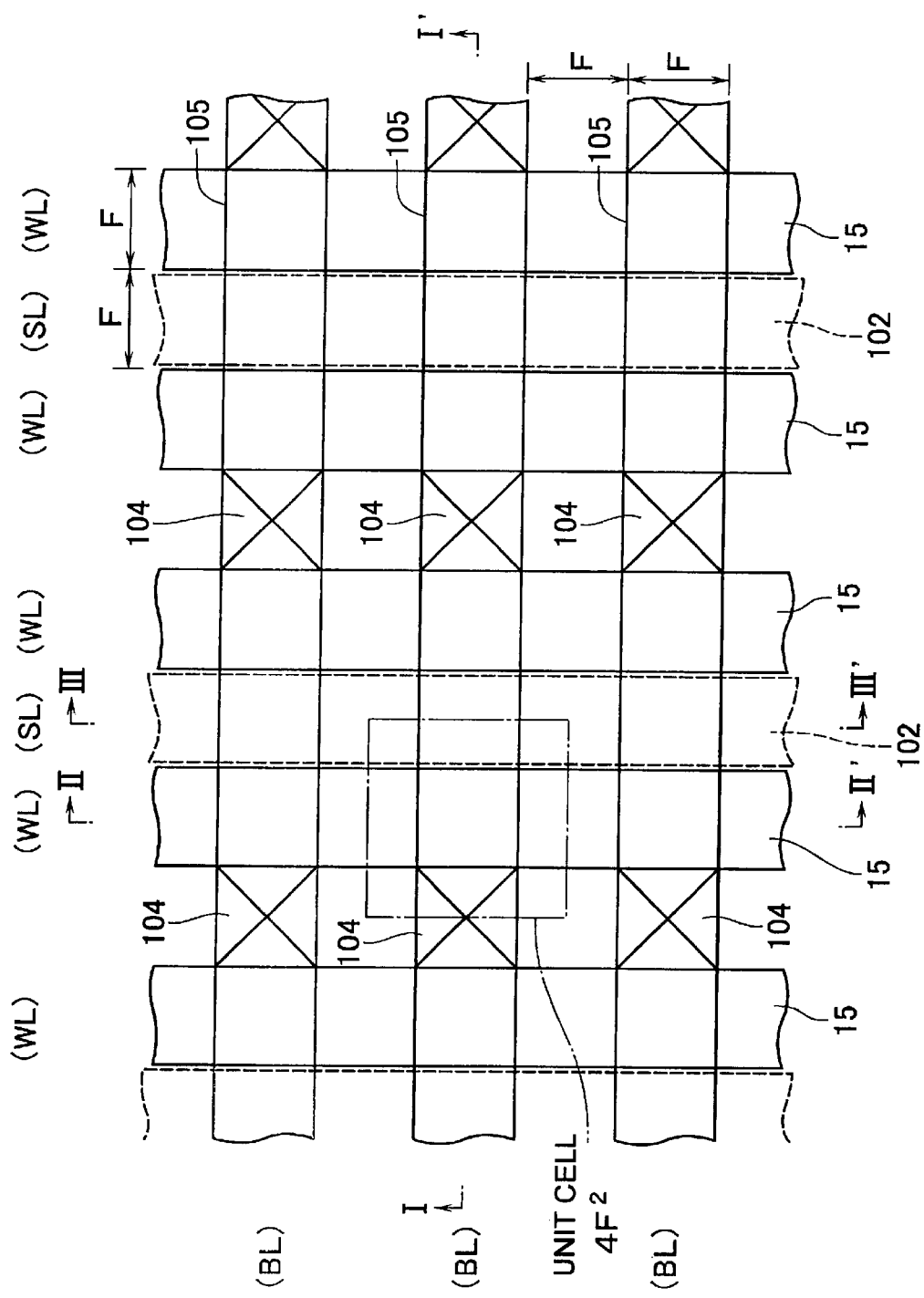
FIG. 21 is a diagram showing a specific layout of the memory cell array according to the cell structure of the first embodiment.
Figure 22:
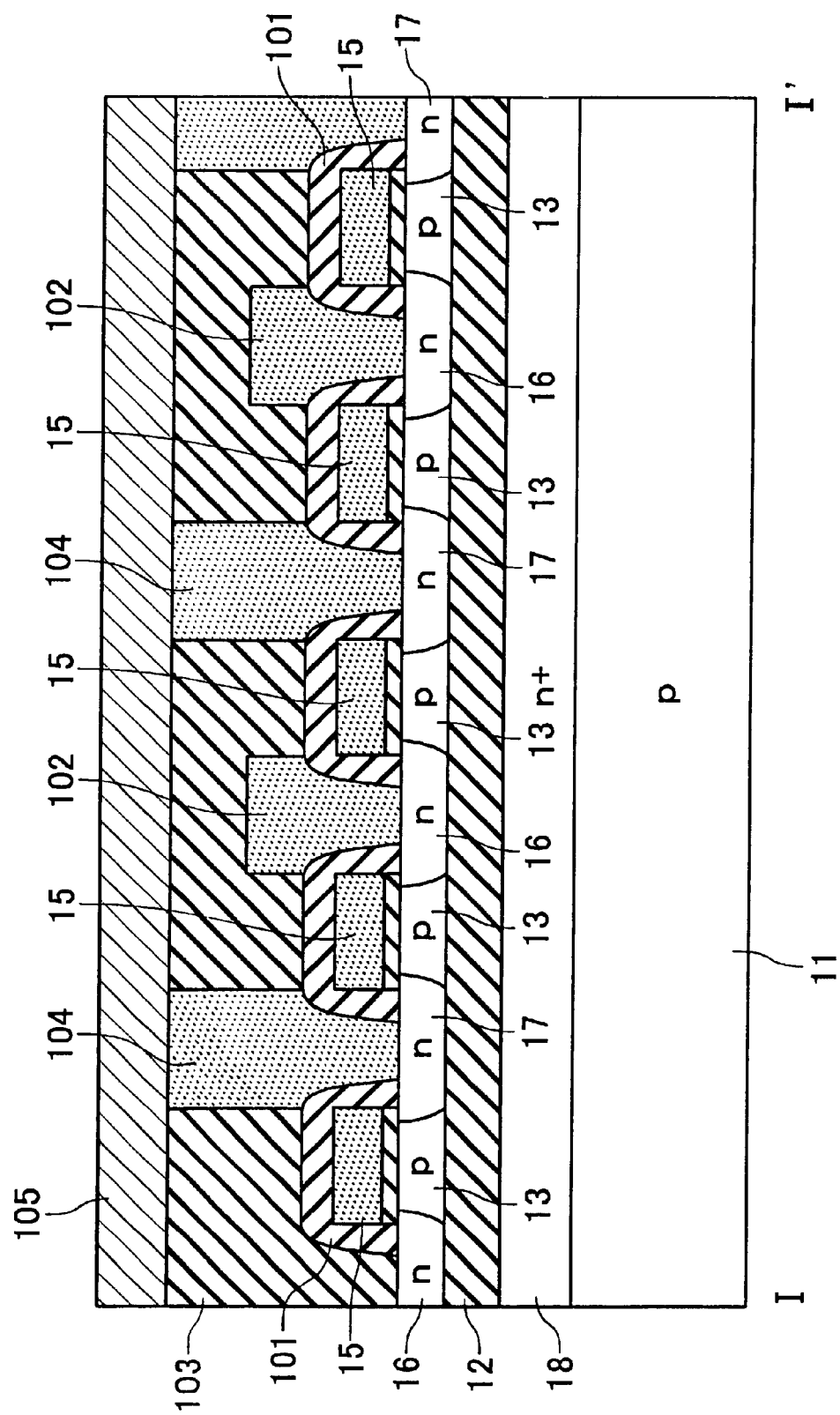
FIG. 22 is a sectional diagram taken along the line I–I' in FIG. 21.
Figure 23:
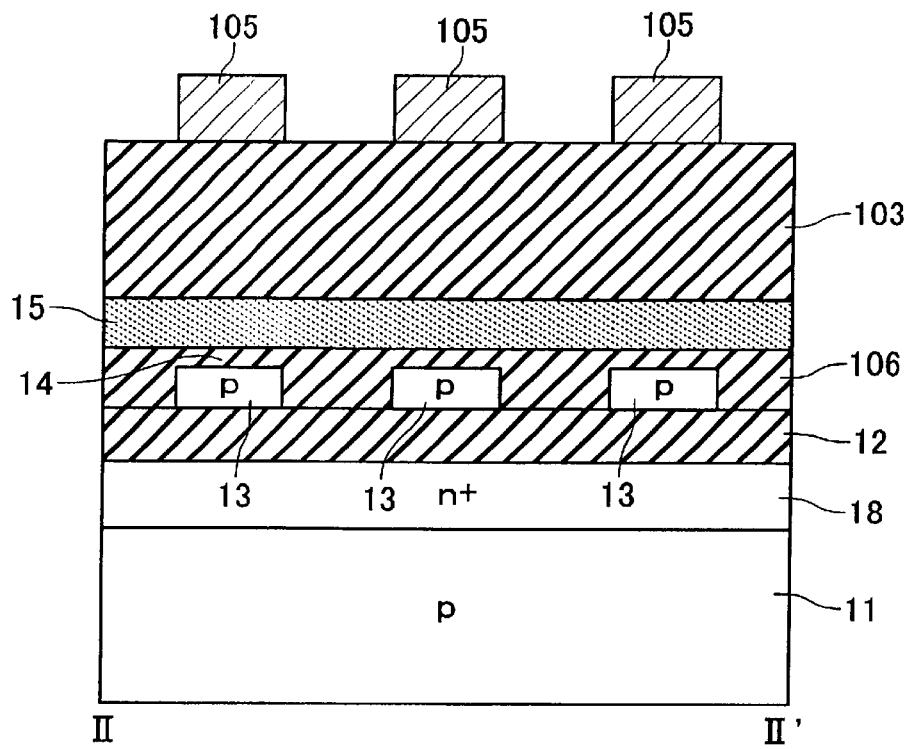
FIG. 23 is a sectional diagram taken along the line II–II' in FIG. 21.
Figure 24:
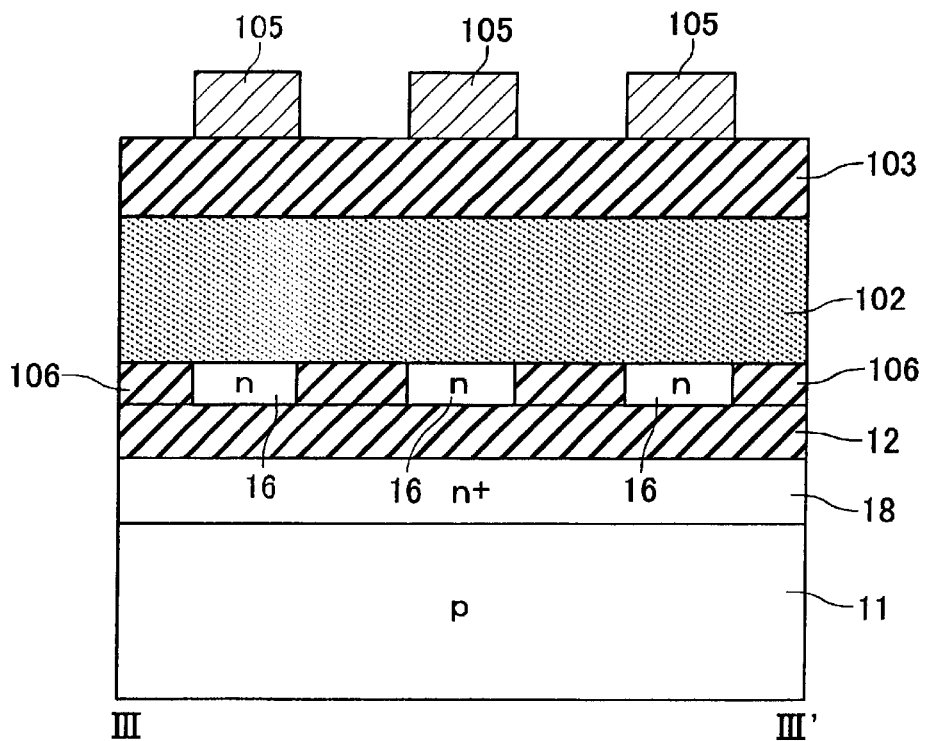
FIG. 24 is a sectional diagram taken along the line III–III' in FIG. 21.

FIG. 21 shows a layout of a concrete cell array according to the first embodiment, and FIGS. 22, 23 and 24 are sectional diagrams taken along the lines I–I', II–II' and III–III' in FIG. 21, respectively. As shown in FIGS. 23 and 24, the p-type silicon layers 13 of the SOI substrate are defined as element forming regions in the form of stripes extending in the bit line direction by an element isolation insulating film 106, which is the STI (shallow trench isolation). Then, the MISFETs are formed and arranged such that the source region 16 and the drain region 17 in the each p-type silicon layer 13 are shared between neighboring MISFETs in the bit line direction, respectively.

The gate electrodes 15 are continuously formed as word lines WL in the direction intersecting the bit lines BL, specifically, perpendicular to the bit lines BL. The top face and both side faces are covered with silicon nitride film 101. In an interlayer insulating film 103 covering the elements, common source lines 102 (SL) are formed as polysilicon wirings and each common source line 102 is commonly connected to the source regions 16 of the MISFETs arranged in the word line direction. Bit lines 105 (BL) are formed on the interlayer insulating film 103, and each bit line 105 is connected to drain regions 17 of the MISFETs. The n$^+$-type layer 18 as the auxiliary gate is formed as a common electrode throughout the whole cell array.

If the word lines WL and the bit lines BL are formed in line/space of the minimum feature size F, a unit cell area is 4 F$^2$ indicated by one dotted chain line in FIG. 21.

Cell Array Structure in the Fifth Embodiment

Figure 25:
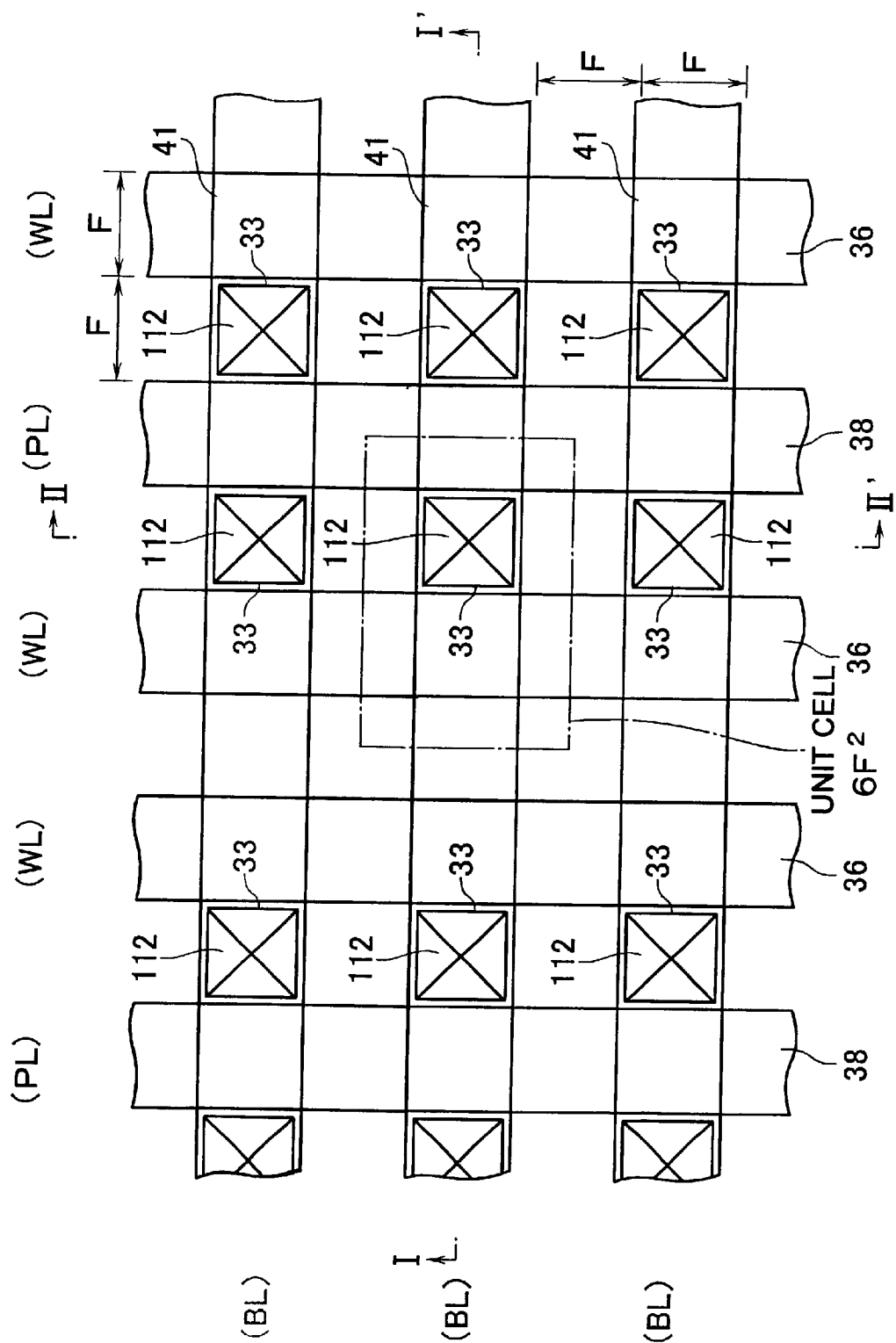
FIG. 25 is a diagram showing a specific layout of the memory cell array according to the cell structure of the fifth embodiment.
Figure 26:
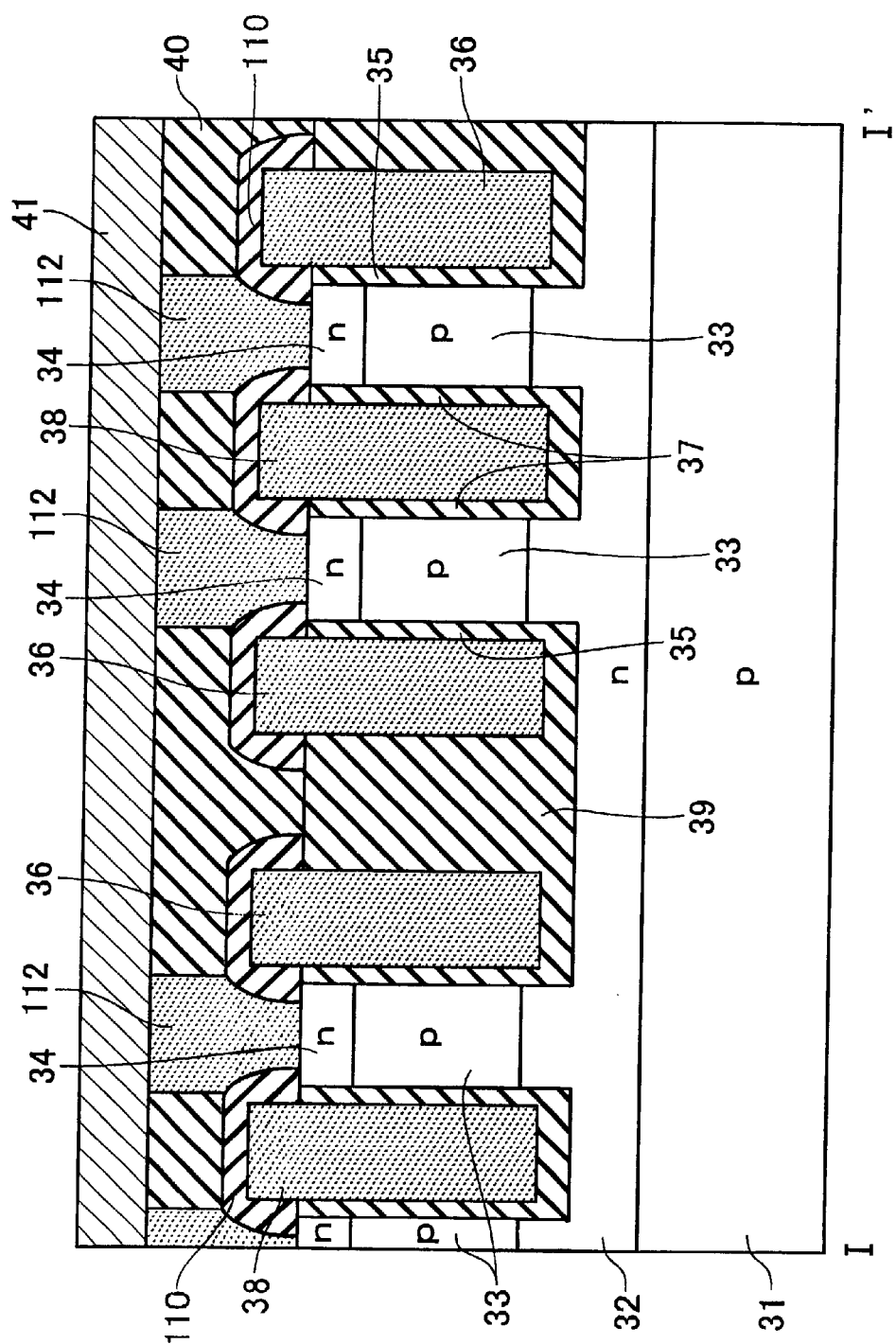
FIG. 26 is a sectional diagram taken along the line I–I' in FIG. 25.
Figure 27:
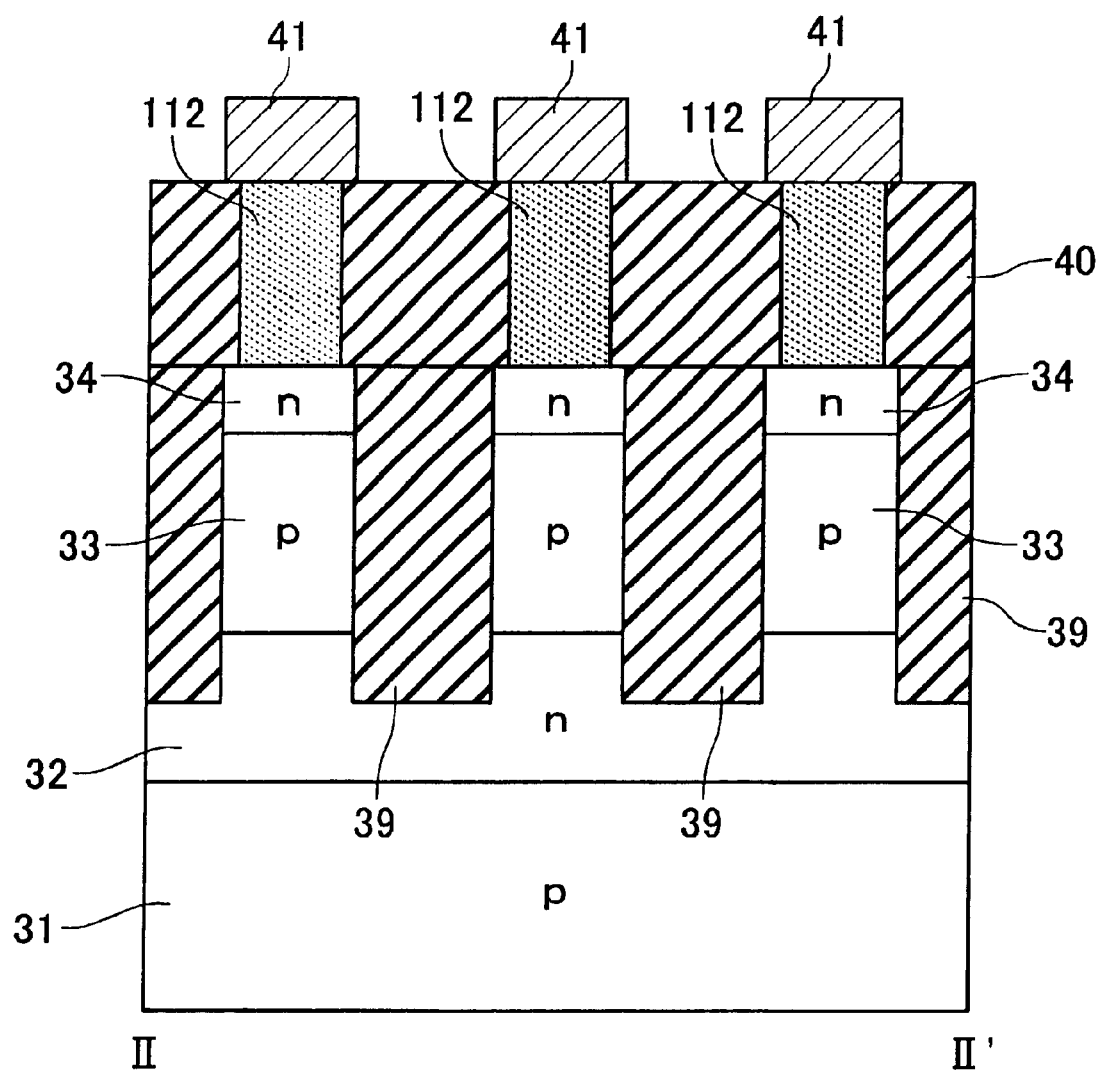
FIG. 27 is a sectional diagram taken along the line II–II' in FIG. 25.

FIG. 25 shows a layout of a concrete cell array according to the fifth embodiment in which the basic cell structure is shown in FIG. 15, and FIGS. 26 and 27 are sectional diagrams taken along the lines I–I' and II–II' in FIG. 25, respectively. A silicon wafer having p/n/p structure is used, and grooves whose depth reach the n-type layer 32 are formed, so that pillar type and p-type silicon portions 33 are formed and arranged. The insulating film 39 is buried in the grooves. Further grooves are formed in the insulating film 39 at the position where the word lines WL and the plate lines PL are buried, and the main gates 36 and the auxiliary gates 38 are buried at both sides of each silicon portion 33 such that the main gates 36 are opposite to the auxiliary gates 38 via the gate insulating films 35 and 37. As shown in FIG. 25, the main gates 36 and the auxiliary gates 38 are formed and patterned as word lines WL and plate lines (auxiliary word lines) PL in parallel with one another.

Although the gate insulating films 35 and 37 are formed with the same process when the thickness of the gate insulating films 35 and 37 are the same, separate processes are needed when they have different thickness. The top face and the both side faces of the main gates 36 and the auxiliary gates 38 are covered with silicon nitride films 110. After the drain regions 34 are formed with a diffusion process in the top portions of the silicon portions 33, the interlayer insulating film 40 is deposited. Contact plugs 112 are buried in the interlayer insulating film 40, the bit lines 41 (BL) are provided on the interlayer insulating film 40, and then the cell array is constituted.

As shown in FIG. 25, each plate line PL is arranged between two word lines WL and WL so as to be shared between two neighboring memory cells in the bit line direction. In this embodiment, if the line/space of the word lines WL and the plate lines PL is F and the line/space of the bit lines BL is F, a unit cell area is 6 F$^2$.

Cell Array Structure in the Sixth Embodiment

Figure 28:
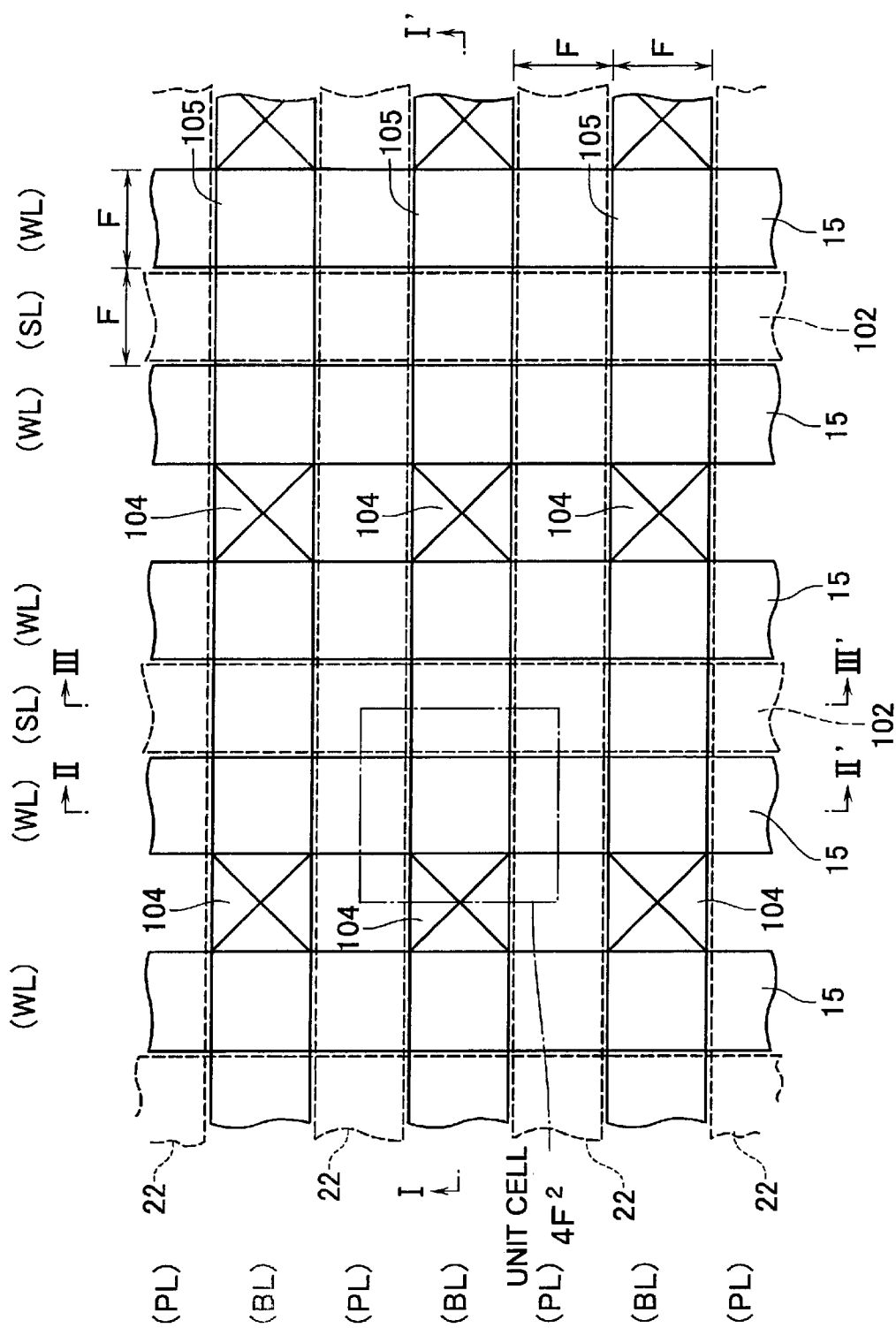
FIG. 28 is a diagram showing a specific layout of the memory cell array according to the cell structure of the sixth embodiment.
Figure 29:
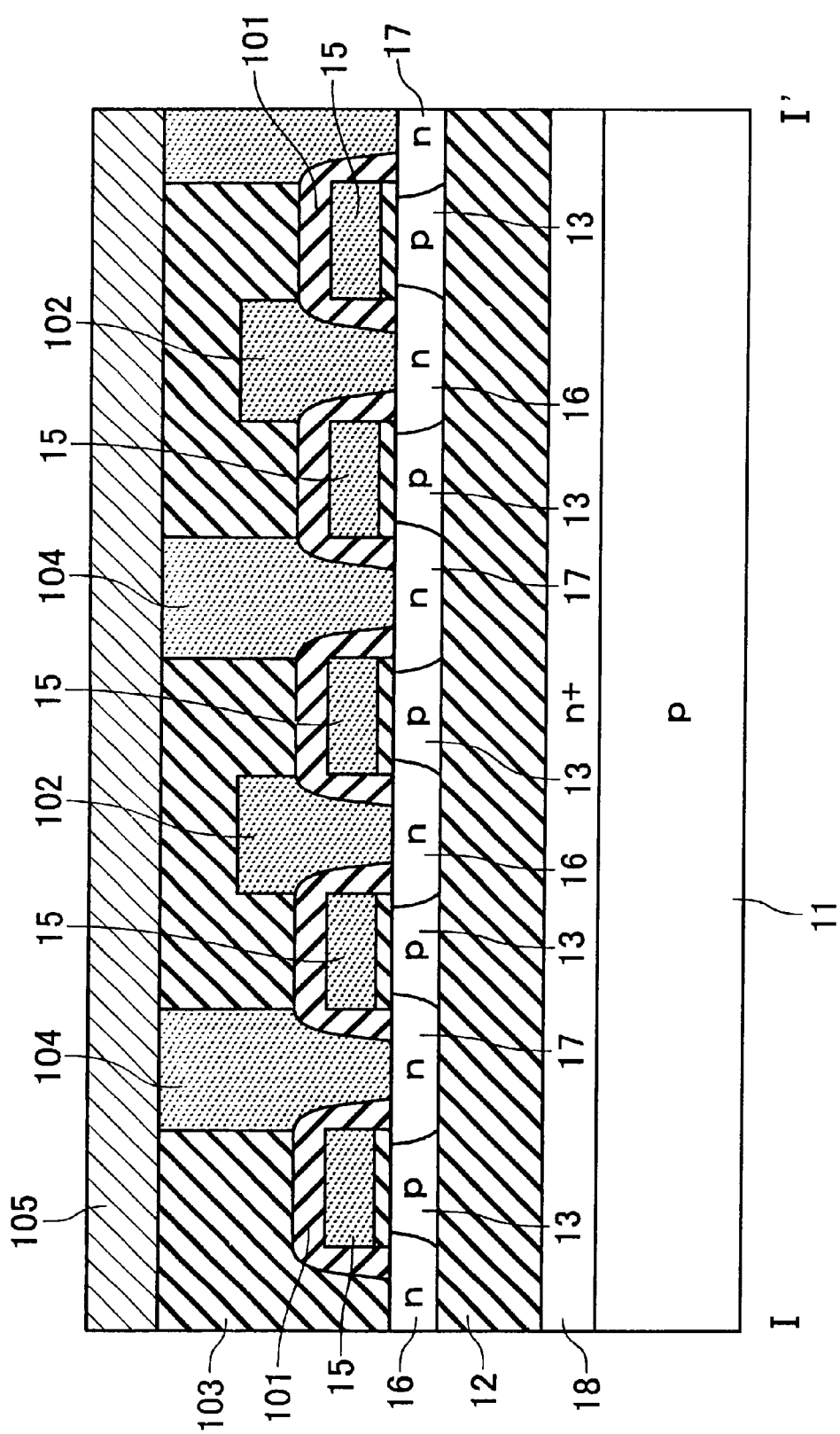
FIG. 29 is a sectional diagram taken along the line I–I' in FIG. 28.
Figure 30:
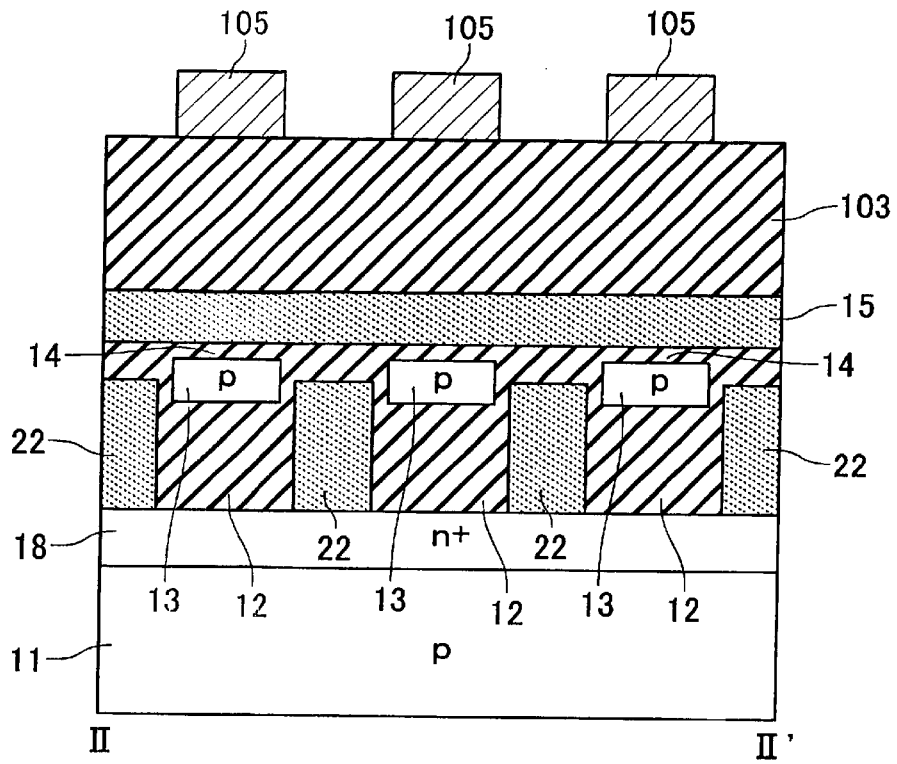
FIG. 30 is a sectional diagram taken along the line II–II' in FIG. 28.
Figure 31:
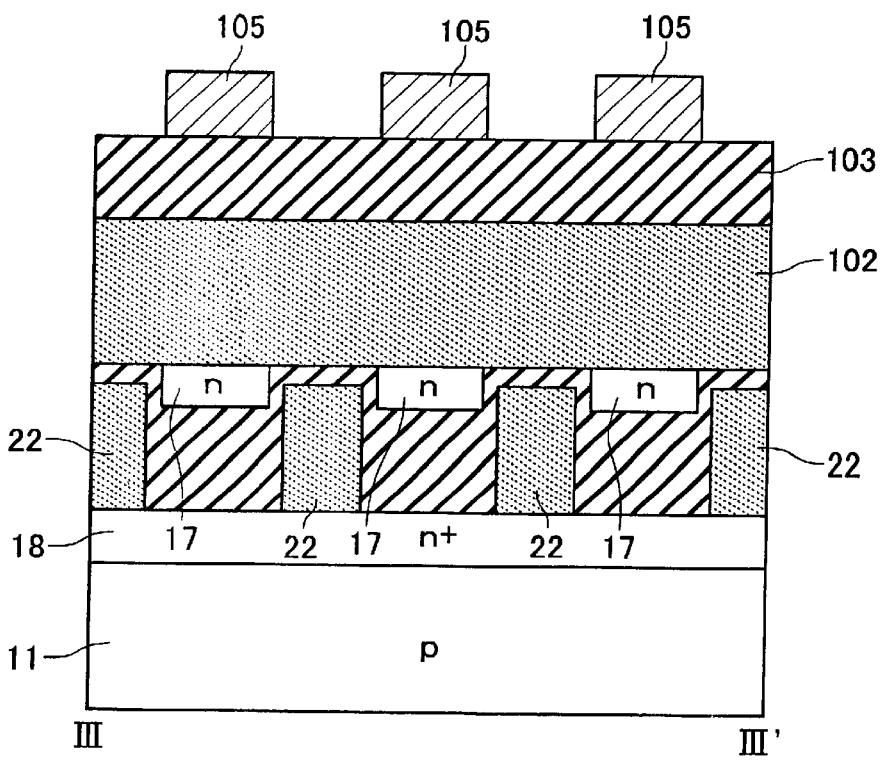
FIG. 31 is a sectional diagram taken along the line III–III' in FIG. 28.

FIG. 28 shows a layout of a concrete cell array according to the sixth embodiment in which the basic cell structure is shown in FIG. 16, and FIGS. 29, 30 and 31 are sectional diagrams taken along the lines I–I', II–II' and III–III' in FIG. 28, respectively. The basic cell array structure of FIGS. 28 and 29 is the same as that of FIGS. 21 and 22. However, it is different that the polysilicon portions 22 are buried to constitute auxiliary gates in parallel with the bit lines BL at each position between bit lines BL and BL. As shown in FIG. 30, the polysilicon portions 22 are buried in the BOX layer 12 so as to be opposite to each other at the bottom side faces of each p-type silicon portion 13. In this embodiment, their top faces are located at the middle of thickness of the p-type silicon portions 13, so that they constitute the plate lines (auxiliary word lines) PL.

Equivalent Circuit of the Memory Chip

Figure 32:
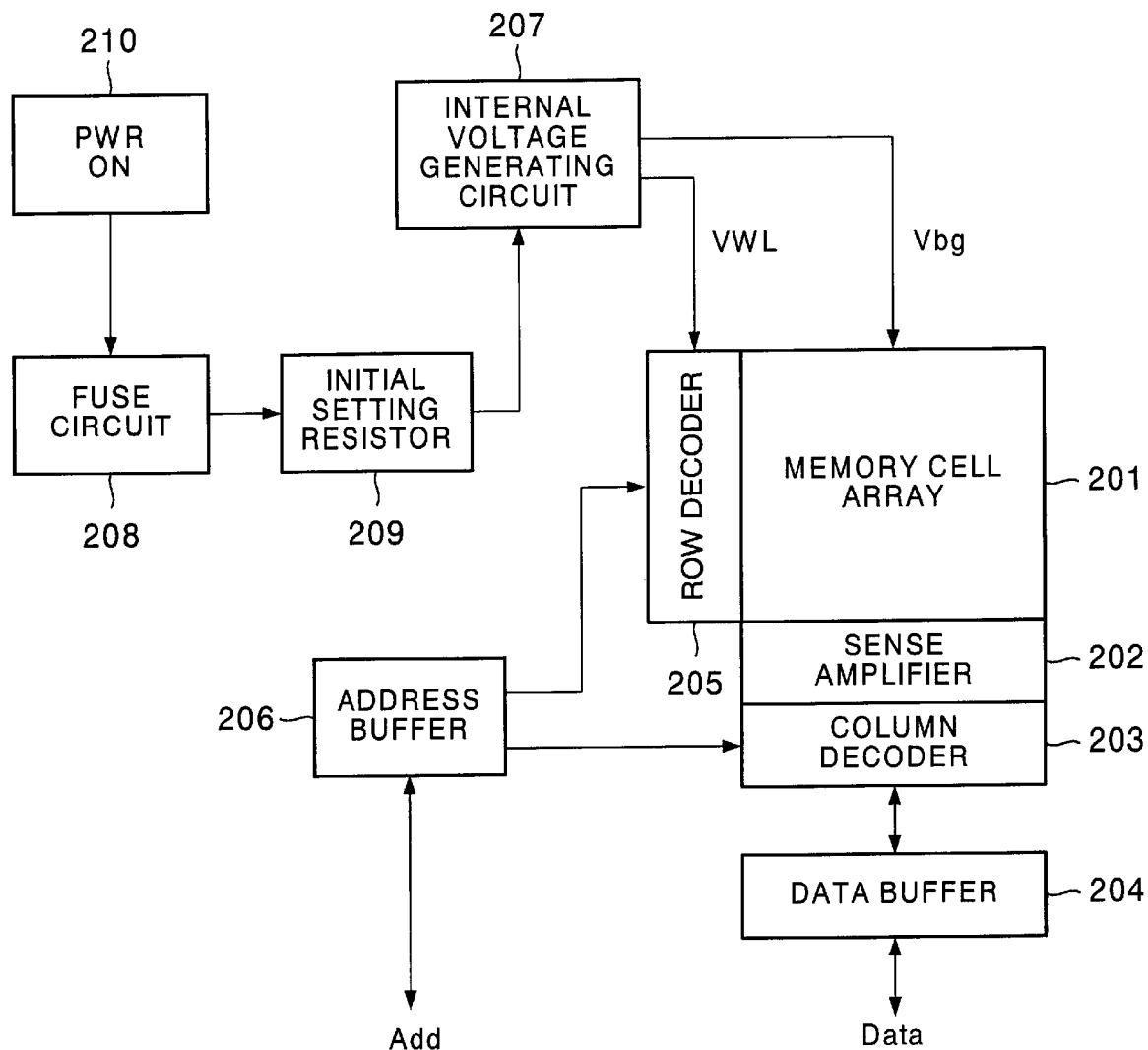
FIG. 32 is a diagram showing an equivalent circuit of a memory chip including a memory cell array having the memory cells according to any one of the embodiments.

Although the examples of the cell array structure are explained hereinbefore, an equivalent circuit of the memory chip including peripheral circuits is shown in FIG. 32. The word lines WL are the main gates in the memory cell array 201, and they are selectively driven by a row decoder (including a word line driver) 205. The bit lines BL are connected to a sense amplifier 202, and then the data write and the data read is performed between the bit lines of the column selected by a column decoder 203 and an I/O terminal via a data buffer 204.

An address signal is input to an address buffer 206, a row address is decoded by the row decoder 205 and a column address is decoded by the column decoder 203.

Various control signals applied to the word lines in the cell array 201 via the row decoder 205 and the auxiliary gate voltage Vbg applied to the auxiliary gate are generated by an internal voltage generating circuit 207 using a booster circuit and so on. As described above, the various control signals include a high level voltage VWLHW of the word line on the write operation, a voltage VWLHR of the word line on the read operation and a low level voltage VWLL of word line on the holding state. An initial setting resistor 209 is provided in order to set an output voltage from the internal voltage generating circuit 207 at the optimum value in each chip.

As mentioned above, in accordance with the test result, a fuse circuit 208 is provided as the nonvolatile memory circuit in order to set various voltages output from the internal voltage generating circuit 207 at the optimum value. According to the programming of the fuse circuit 208, initial setting values of the various voltages are decided. On the occasion of the memory operation, a power-on detecting circuit 210 detects a power-on and the data in the fuse circuit 208 is automatically read into the initial setting resistor 209 based on the output from the power-on detecting circuit 210. The internal voltage generating circuit 207 is controlled by the output from the initial setting resistor 209, so that the optimum control voltage VWL, the auxiliary gate voltage Vbg and so on are generated in each chip.

What is claimed is:

1. A semiconductor memory device
   a semiconductor substrate; and
   memory cells formed on the semiconductor substrate via an insulating film, each of the memory cells being a unit for storing one bit data and each of the memory cells consisting of one full depletion type MISFET, wherein each of the memory cells comprises:
      a semiconductor layer formed on the insulating film;
      a source region formed in the semiconductor layer;
      a drain region formed apart from the source region in the semiconductor layer, the semiconductor layer between the source region and the drain region serving as a channel body in a floating state;
      a main gate formed on a first side of the channel body to form a channel in the channel body; and
      an auxiliary gate formed on a second side of the channel body, the second side being opposite to the first side,
   wherein the MISFET has a first data state in which the majority carriers are accumulated in a portion of the second side of the channel body and a second data state in which the majority carriers accumulated in the portion of the second side of the channel body are emitted.

2. The semiconductor memory device according to claim 1,
   wherein the first data state is set by the impact ionization generated near a drain junction with a pentode operation of the MISFET, and
   the second data state is set by sending a forward bias current between the channel body and the drain region.

3. The semiconductor memory device according to claim 1, wherein the first side of the channel body is a top side face of the semiconductor layer, the second side of the channel body is a back side face of the semiconductor layer and the main gate is formed on a top side face via a gate insulating film.

4. The semiconductor memory device according to claim 3, wherein the auxiliary gate is an impurity diffusion layer formed on the semiconductor substrate.

5. The semiconductor memory device according to claim 3, wherein the auxiliary gate is an impurity doping layer buried between the semiconductor substrate and the insulating film.

6. A semiconductor memory device having full depletion type MISFETs to constitute memory cells on a semiconductor substrate via an insulating film, each of the MISFETs comprising:
   a semiconductor layer formed on the insulating film;
   a source region formed in the semiconductor layer;
   a drain region formed apart from the source region in the semiconductor layer, the semiconductor layer between the source region and the drain region serving as a channel body in a floating state;
   a main gate formed on a first side of the channel body to form a channel in the channel body; and
   an auxiliary gate formed on a second side of the channel body, the second side being opposite to the first side, the auxiliary gate being connected to an auxiliary gate terminal to which a constant voltage is applied,
   wherein the MISFET has a first data state in which the majority carriers are accumulated in a portion of the second side of the channel body and a second data state in which the majority carriers accumulated in the portion of the second side of the channel body are emitted.

7. The semiconductor memory device according to claim 6, wherein the first data state is set by the impact ionization generated near a drain junction with a pentode operation of the MISFET, and the second data state is set by sending a forward bias current between the channel body and the drain region.

8. The semiconductor memory device according to claim 6, wherein the first side of the channel body is a top side face of the semiconductor layer, the second side of the channel body is a back side face of the semiconductor layer and the main gate is formed on a top side face via a gate insulating film.

9. The semiconductor memory device according to claim 8, wherein the auxiliary gate is an impurity diffusion layer formed on the semiconductor substrate.

10. The semiconductor memory device according to claim 8, wherein the auxiliary gate is an impurity doping layer buried between the semiconductor substrate and the insulating film.

* * * * *